(12) United States Patent
Gao et al.

(10) Patent No.: US 10,948,837 B2
(45) Date of Patent: Mar. 16, 2021

(54) INFORMATION DETERMINING APPARATUS AND METHOD

(71) Applicant: ASML NETHERLANDS B.V., Veldhoven (NL)

(72) Inventors: An Gao, Eindhoven (NL); Sanjaysingh Lalbahadoersing, Helmond (NL); Andrey Alexandrovich Nikipelov, Eindhoven (NL); Alexey Olegovich Polyakov, Veldhoven (NL); Brennan Peterson, Longmont, CO (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/629,359

(22) PCT Filed: Jun. 18, 2018

(86) PCT No.: PCT/EP2018/066106
§ 371 (c)(1),
(2) Date: Jan. 8, 2020

(87) PCT Pub. No.: WO2019/015899
PCT Pub. Date: Jan. 24, 2019

(65) Prior Publication Data
US 2020/0159134 A1 May 21, 2020

(30) Foreign Application Priority Data

Jul. 17, 2017 (EP) ..................................... 17181716
Dec. 4, 2017 (EP) ..................................... 17205177

(51) Int. Cl.
*G01B 11/00* (2006.01)
*G03F 9/00* (2006.01)
(Continued)

(52) U.S. Cl.
CPC ........ *G03F 9/7088* (2013.01); *G03F 7/70633* (2013.01); *G03F 9/7073* (2013.01);
(Continued)

(58) Field of Classification Search
CPC .... G03F 7/70633; G03F 9/7073; G03F 9/708; G03F 9/7088; H01L 2223/54426;
(Continued)

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| EP | 3309617 | 4/2018 |
| JP | S56126921 | 10/1981 |

(Continued)

OTHER PUBLICATIONS

International Search Report and Written Opinion issued in corresponding PCT Patent Application No. PCT/EP2018/066106, dated Oct. 12, 2018.

(Continued)

*Primary Examiner* — Peter B Kim
(74) *Attorney, Agent, or Firm* — Pillsbury Winthrop Shaw Pittman LLP

(57) ABSTRACT

An apparatus for determining information relating to at least one target alignment mark in a semiconductor device substrate. The target alignment mark is initially at least partially obscured by an opaque carbon or metal layer on the substrate. The apparatus includes an energy delivery system configured to emit a laser beam for modifying at least one portion of the opaque layer to cause a phase change and/or chemical change in the at least one portion that increases the transparency of the portion. An optical signal can propagate (Continued)

through the modified portion to determine information relating to the target alignment mark.

21 Claims, 12 Drawing Sheets

(51) Int. Cl.
　　*G03F 7/20* (2006.01)
　　*H01L 23/544* (2006.01)
(52) U.S. Cl.
　　CPC .. *H01L 23/544* (2013.01); *H01L 2223/54426* (2013.01); *H01L 2223/54453* (2013.01)
(58) Field of Classification Search
　　CPC ......... H01L 2223/54453; H01L 23/544; H01L 21/02115; C23C 16/26
　　See application file for complete search history.

(56) References Cited

U.S. PATENT DOCUMENTS

| | | | |
|---|---|---|---|
| 5,523,193 | A | 6/1996 | Nelson |
| 6,303,459 | B1 | 10/2001 | Chen |
| 6,952,253 | B2 | 10/2005 | Lof et al. |
| 6,961,116 | B2 | 11/2005 | Den Boef et al. |
| 8,767,183 | B2 | 7/2014 | Den Boef |
| 2005/0186753 | A1 | 8/2005 | Chen et al. |
| 2006/0016561 | A1 | 1/2006 | Choi et al. |
| 2006/0079067 | A1 | 4/2006 | Shin et al. |
| 2007/0085991 | A1 | 4/2007 | Liegl et al. |
| 2007/0212652 | A1 | 9/2007 | Lalbahadoersing et al. |
| 2010/0214550 | A1 | 8/2010 | Hulsebos et al. |
| 2012/0008127 | A1 | 1/2012 | Tel et al. |
| 2016/0268211 | A1 | 9/2016 | Hagio |
| 2017/0372899 | A1* | 12/2017 | Yang .................. H01L 21/0234 |

FOREIGN PATENT DOCUMENTS

| | | |
|---|---|---|
| JP | S639933 | 1/1988 |
| JP | H01140625 | 6/1989 |
| JP | H1167660 | 3/1999 |
| JP | 2001203146 | 7/2001 |
| JP | 2006114897 | 4/2006 |
| JP | 2016170350 | 9/2016 |
| WO | 99/49504 | 9/1999 |
| WO | 2011/081645 | 7/2011 |
| WO | 2015/101458 | 7/2015 |
| WO | 2015/110191 | 7/2015 |

OTHER PUBLICATIONS

Taiwanese Office Action issued in corresponding Taiwanese Patent Application No. 107124563, dated Jun. 12, 2019.
Kim, Sunmi et al.: "Photoelectrochemical anodization for the preparation of a thick tungsten oxide film", Electrochemistry Communications, vol. 17, Jan. 6, 2012.
Narayan, Jagdish et al.: "Research Update: Direct conversion of amorphous carbon into diamond at ambient pressures and temperatures in air", APL Materials, vol. 3, No. 10, Oct. 1, 2015.
Pan, Yusong et al.: "Threshold Dependence of Deep-and Near-subwavelength Ripples Formation on Natural $MoS_2$ Induced by Femtosecond Laser", Scientific Reports 6, Article No. 19571, Jan. 22, 2016.
Harilal S.S.et al.: "Background gas collisional effects on expanding fs and ns laser ablation plumes", Applied Physics, vol. 117, No. 1, 2014.
Maia, Francisco C.B. et al.: "Synthesis of diamond-like phase from graphite by ultrafast laser driven dynamical compression", Scientific Reports, Article No. 11812, Jul. 7, 2015.
Nánaia, Laszlo et al.: "Laser-induced oxidation in metals: state of the art", Thin Solid Films, vol. 298, 1997.
Bauersfeld, Marie-Luise et al.: "Nanoporous Tungsten Trioxide Grown by Electrochemical Anodization of Tungsten for Gas Sensing Applications", Procedia Engineering, vol. 47, Sep. 9, 2012.
Yang et al.: "Thick porous tungsten trioxide films by anodization of tungsten in fluoride containing phosphoric acid electrolyte", Electrochemistry Communications, vol. 11, 2009.
Japanese Office Action issued in corresponding Japanese Patent Application No. 2019-571321, dated Dec. 11, 2020.

* cited by examiner

INFORMATION DETERMINING APPARATUS AND METHOD

CROSS-REFERENCE TO RELATED APPLICATIONS

This application is the U.S. national phase entry of PCT Patent Application No. PCT/EP2018/066106, which was filed Jun. 18, 2018, which claims the benefit of priority of European Patent Application No. 17181716.6, which was filed on Jul. 17, 2017, of and European Patent Application No. 17205177.3, which was filed on Dec. 4, 2017, which are incorporated herein in their entireties by reference.

FIELD

The present disclosure relates to determining information during manufacture of a semiconductor device.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Amorphous carbon layers, which may be used as so-called "hard masks", are deposited on certain substrate layers in order to provide a high aspect ratio etch as part of an IC or semiconductor device manufacturing process. Carbon layers may be used for etching deep, high aspect ratio structures within ICs. Amorphous carbon layers are widely used in manufacturing of Dynamic Random-Access Memory (DRAM) and 3D Negative-AND (NAND) devices, for example. However, carbon layers may also be used in manufacturing of other types of ICs and semiconductor devices.

At various stages during the IC manufacturing process, it may be necessary to align a substrate comprising an IC or semiconductor device such that a pattern of structures forming part of the IC or semiconductor device is accurately printed on top of underlying patterns. A misalignment may result in a so-called overlay (OV) error between adjacent layers in the IC or semiconductor device, which may result in a non-operational or sub-optimal device. In order to verify the alignment of the IC or semiconductor device, an appropriate instrument such as an alignment sensor may be used to measure information such as the position and/or orientation of a feature such as an alignment feature or other mark provided in at least one of the layers.

If a carbon layer is present, the alignment sensor may not be able to detect the features underlying the carbon layer due to the carbon layer absorbing radiation at the alignment sensor operating wavelength(s). Without accurate detection of these features, it may be difficult to achieve the necessary accuracy (e.g. nm placement accuracy in some cases) for printing structures in the layers of the substrate.

Similar issues may arise with metallic layers provided in IC devices (e.g. 3D IC devices) and other semiconductor devices. Such devices may create challenges for alignment procedures, because such layers may be opaque to the alignment sensor operating wavelength(s). Metallic layers may have high refraction and extinction coefficients, thus preventing the alignment sensor measuring information obtained from features located below the opaque layer(s).

Opaque metal or carbon layers are or will be used as a hard mask or as functional layers in at least the following devices:

3D-NAND devices may include carbon or doped carbon hard masks. Such devices may include heavy metal (e.g. Tungsten (W)) hard masks having a thickness of ~0.4-2 µm.

3D X-point devices use multiple metal layers (e.g. W layers) with each layer having a thickness of ~20-100 nm.

Due to a combination of high reflectivity at interfaces of the metal layer(s) with other substrate layers (e.g. metal/ (bottom anti-reflection coating (BARC) or resist), metal/ ceramic, metal/semiconductor), and attenuation of light due to the high extinction coefficient of the metal layers, insufficient signal levels may be detected by the alignment sensor after passing through the opaque metal layer(s).

High reflectivity from the opaque metal or amorphous carbon layer(s) may lead to the alignment sensor making erroneous or false measurements. Further, such an opaque layer may follow the topography of layers below, and may thus carry a pattern of a feature (such as an alignment mark, grating, or the like) provided on one of those layers. However, such a feature may be present on the opaque layer at a shifted location with respect to the location of the original feature. For example, a shift of ~1-10 nm may be observed in some cases, with a shift of comparable magnitude to the thickness of the metal layer being possible in the worst case. The level of shift may be dependent on chemical-mechanical polishing (CMP), deposition and/or other operations corresponding to manufacturing of such a layer and the layers below. Similarly, the opaque layer properties (e.g. refractive index n, extinction coefficient k, or the like) may be distorted by the topography or composition of layers below and thus the light reflected from the opaque layer may be imprinted with the shifted feature/mark pattern. For 3D X-point devices, the shift may be of the order of 1-2 nm.

Various techniques may be used to improve alignment where opaque metallic or carbon layers are used. For example, in a clearout procedure, a litho-etch step may be performed on a region of an opaque layer above the feature/ mark so that the material in this region can be removed. The region may then be re-filled with an alternative (and preferably not optically opaque) material. Finally, a CMP step may be used to planarize the surface and remove the re-filler material from the rest of the opaque layer (i.e. those regions other than the region above the alignment feature). However, some of these steps may be expensive (e.g. a dry etch which may be used in the case of clear out made in the relatively thick hard mask).

Another procedure used to improve alignment where opaque metallic or carbon layers are used may involve the printing of additional features or other marks that are referenced to original alignment features/marks that are provided within the substrate; such additional features being visible at the top interface of an opaque layer. Such a procedure may require several extra litho-etch/deposit steps, which may: be expensive, lower the yield due to contamination and variabilities introduced with extra process steps; and/or may deteriorate product overlay (i.e. due to the build-up of errors when copying the feature/mark to later layers).

A current approach for alignment of a substrate comprising a carbon layer includes providing additional alignment features or marks in upper or intermediate layers of the substrate to determine the alignment of the substrate using an alignment sensor. In an example, the alignment sensor may be configured to detect a reflection from an alignment feature in a top surface of an amorphous carbon layer.

SUMMARY

There is provided apparatus, tools, methods and systems for or relating to determining information, for example, relating to position and/or alignment of a feature such as a target alignment mark or the like in a substrate, for example, during manufacture of a semiconductor device comprising the substrate.

The apparatus, tools, methods and/or systems described herein may provide the ability to at least one of: determine information in a cost effective manner; determine the information with fewer steps and/or in less time than other solutions; reduce or avoid the risk of contamination affecting the substrate; provide improved reliability and/or accuracy of measurements relating to determining the information; increase yield of products; and/or enable the information to be determined through relatively opaque and/or reflective layers in the substrate.

According to an example of the present disclosure there is provided an apparatus for determining information relating to at least one feature in a semiconductor device substrate. The at least one feature may be at least partially obscured by a layer comprising carbon, such that an optical signal for determining the information relating to the at least one feature may be prevented from reaching the feature. The at least one feature may be at least partially obscured by a layer comprising metal, such that an optical signal for determining the information relating to the at least one feature may be prevented from reaching the feature. The apparatus may comprise an energy delivery system. The energy delivery system may be configured for modifying the at least one portion of the layer to increase its transparency, such that at least part of the optical signal can propagate through the at least one portion of the layer for determining the information relating to the at least one feature.

In use, the energy delivery system may structurally modify the at least one portion of the layer comprising carbon, which may comprise or define a hard mask of the substrate, such that the transparency of the at least one portion may be increased. The energy delivery system may chemically and/or structurally modify at least one portion of the layer comprising metal to increase the transparency of the at least one portion. Increasing the transparency of the portion may allow the optical signal for determining the information relating to the at least one feature to propagate through the at least one portion to reach the feature, which may be in the form of an alignment mark, target alignment mark, overlay feature, metrology target, or any other feature in the substrate. The optical signal may interact with the at least one feature such that a return optical signal may propagate through the at least one portion. At least one property of the return optical signal may be measured in order to determine the information relating to the at least one feature. The information provided by the return optical signal may indicate at least one of: the presence, position, orientation, and/or the like of the at least one feature by allowing a direct measurement through the modified at least one portion by the optical signal. Allowing the direct measurement may mean that fewer litho and/or etching and/or deposition steps are required during manufacture of the semiconductor device substrate, which may reduce the time and expense involved in the manufacturing process. The direct measurement may allow the apparatus to more accurately determine the alignment of the substrate than an indirect alignment method, which may decrease the error in the overlay between the layers comprising semiconductor structures, conductor structures, insulator structures and/or other structures.

The energy delivery system may be configured to emit a beam for modifying the at least one portion of the layer by reducing the extinction and/or refraction coefficient of the carbon at the at least one portion of the layer.

The energy delivery system may be configured to emit a beam for modifying the at least one portion of the layer by causing a phase change in the carbon (e.g. at the at least one portion of the layer) and/or causing an increase in the concentration of tetravalent (sp3-coordinated) carbon atoms at the at least one portion of the layer.

The beam may comprise the radiation and/or particles.

Causing the phase change in the carbon may reduce the extinction coefficient of the layer for a given wavelength. For example, modifying the layer may cause a reduction in the extinction coefficient 'k' from above 0.4 to below 0.4, 0.2, 0.1, or the like for at least one wavelength from the range 0.5 μm-2 μm.

The phase change may modify the carbon at the at least one portion of the layer such that the carbon forms at least one of: diamond; and diamond-like carbon.

The layer may comprise amorphous carbon, graphite, DLC and/or diamond, or any other form of carbon. The layer may comprise a material which is different to graphite or DLC. The layer may comprise at least 10-50%, or any other percentage, of carbon or doped carbon. The layer may comprise carbon doped with at least one of: hydrogen, boron, tungsten, nitrogen and/or any other appropriate element, compound or impurity.

After exposure to the beam delivery system, the carbon layer may comprise and/or increase in concentration of diamond, or diamond-like domains. The size of diamond or DLC domains may be limited to about either of the values ($n^{-0.3}$, h), where n is the concentration of dopants and h is the thickness of the layer. Diamond domains comparable to the thickness of the layer (e.g. ~0.5-5 μm) may be microdiamonds. The micro-diamonds may behave as efficient scattering centres for the radiation of an alignment system for determining the information. Examples of wavelengths which may be scattered by the microdiamonds comprise: 0.5 to 1 μm, 1 to 2 μm, or any other possible wavelength ranges. Replacing the microdiamonds with smaller scatterers such as nano-diamonds (e.g. d<0.1 μm) may improve the visibility of the at least one feature through the at least one portion, which may be due to less scattering occurring in the layer. Appropriate selection of an alignment determination system or other optical system operating at a certain wavelength or wavelengths may reduce the effect of the scattering depending on the size and/or concentration of the scatterers in the layer. Appropriate selection of composition and/or thickness of the layer comprising carbon and/or sublayers within this layer in combination with adjusting the fluence and/or power and/or phase distribution of the radiation and/or particles of the energy delivery system may reduce the average (or maximum) size of the scatterers, for example, by converting the layer to comprise nano-diamonds instead of micro-diamonds, or the like.

Diamond and diamond-like carbon (DLC) may have an extinction coefficient of below 0.1 for at least one wavelength in the visible and/or the infrared spectrum.

The energy delivery system may comprise at least one of: at least one laser for emitting the radiation and/or at least one source of a focused beam of energetic particles.

The at least one laser may be configured to irradiate the at least one portion in a scanner, for example, a scanner used during the manufacturing process if resist has been applied to the substrate. It will be appreciated that distortion of resist may occur in the scanner, since resist has a lower boiling temperature than the layer comprising carbon. The at least one laser may be configured to irradiate the at least one portion using a separate energy source, for example, as part of a standalone tool for modifying the at least one portion and/or for determining information relating to the at least one feature. In this example, laser irradiation of the at least one portion may be performed prior to application of optional extra hard mask material, bottom anti-reflection coating (BARC), and/or resist layers on the substrate.

Replacing at least one litho-etch step during manufacture of the substrate, with a potentially much cheaper laser irradiation step, may improve overlay by direct alignment through the layer comprising the at least one portion. Time and expense may be saved by avoiding a step that includes refilling the clear out by material that is transparent for the wavelength of the optical signal and, optionally, etch resistant.

The at least one laser may comprise a pulsed laser source configured to emit a series of laser pulses. The pulse laser source may be configured to emit at least one laser pulse.

The at least one laser may be configured to emit radiation having at least one wavelength in a range from 4 nm to 3 μm. It will be appreciated that the radiation may comprise other wavelength(s) or several wavelengths, for example an output of a harmonic generator, or the like.

The at least one laser may be configured to emit one or more of: visible and/or infrared laser pulses with a pulse duration in a range from 5 fs to 500 ps; ultraviolet laser pulses with a pulse duration in the range 1 ps to 500 ns; and soft X-ray to DUV laser pulses with a pulse duration in the range 1 fs to 100 ns, or the like. The energy delivery system may comprise a laser configured to emit pulses with a duration of less than 100 ns, and optionally less than 10 ns, and optionally more than 10 fs. It will be appreciated that the at least one laser may be configured to emit laser pulses of other pulse duration(s) such as microsecond, nanosecond, picosecond, femtosecond, attosecond pulses, or the like, and/or other wavelength(s) such as in the x-ray, soft x-ray, EUV, DUV, UV, visible, IR, mid-IR, far-IR, THz, or other parts of the electromagnetic spectrum.

The at least one laser may be configured to emit an initial pulse train comprising at least one laser pulse of a first pulse duration. The at least one laser may be further configured to emit a subsequent pulse train comprising at least one laser pulse of a shorter, second pulse duration.

The initial pulse train may comprise a pre-pulse, which may comprise nanosecond and/or picosecond laser pulses. The subsequent pulse train may comprise femtosecond laser pulses. The interaction of the pulse train(s) with the layer may result in a change in the temperature and/or pressure in the at least one portion. By using different pulse durations, the nature of the interaction between the laser pulses and the layer may be controlled such that the temperature and pressure in the at least one portion may be decoupled. For example, there may be a temperature rise associated with the initial pulse train, which may comprise at least one of: nanosecond, picosecond, and femtosecond pulses. There may be a pressure and/or temperature rise associated with the subsequent pulse train, which may comprise femtosecond pulses. By providing at least one laser with at least one different pulse duration, which may have a certain effect on the interaction between the laser pulse and the layer, it may be possible to provide fine or enhanced control of the properties in the at least one portion. For example, it may be possible to control the size, distribution and/or debris particle generation as well as the size of the grains of the phase-changed material by appropriate selection of laser parameters and/or the delay between two or more pulse trains. Nanosecond pulses may be used for initiating the process of modifying the layer. For example, by starting with nanosecond pulses, material in the at least one portion may thermalize at greater than 500° C., 1000° C., 2000° C., or the like. By using a femtosecond pulses, the pressure and/or temperature involved may be significantly larger than for nanosecond pulses. For example, the pressure pulses may be of order of 0.1-10 GigaPascals, or any other pressure; and the temperature involved may be of order 100-10,000° C., or any other temperature. It will be appreciated that any other temperature and/or pressure may be generated in the layer during modification by the radiation and/or particles.

It will be appreciated that any appropriate selection of laser pulses may be used for providing the modification of the at least one portion. For example, while the present example describes the subsequent pulse train as comprising femtosecond pulses, it may be possible to use nanosecond and/or picosecond pulses in the subsequent pulse train. Although nanosecond, picosecond and femtosecond pulse durations are described, it will be appreciated that other pulse duration regimes may be used, such as microsecond, attosecond, and/or the like for either or both of the initial and subsequent pulse trains.

It will be further appreciated that controlling other parameters such as pulse energy, number of pulses, peak radiant fluence, laser repetition rate, dispersion, wavelength(s), polarization, and/or the like, may influence the modification of the at least one portion.

The at least one laser may be configured to emit radiation having a peak radiant fluence or intensity of radiation below an ablation threshold for the layer.

If at least one pulse has a peak radiant fluence or intensity that exceeds an ablation threshold, debris particles may be generated, which may pose a risk for subsequent imaging and overall yield. It will be appreciated that other parameters such as number of pulses, laser repetition rate, thermal conductivity, extinction and/or refraction coefficients of the layer, and/or the like may influence the ablation threshold.

The at least one laser may be configured to emit at least one of: a linear polarized radiation; non-linear polarized radiation; elliptical polarized radiation; and spiral polarized radiation.

The at least one laser may be configured to emit a sequence of laser pulses. Each laser pulse may have one of: linear polarization; circular polarization; elliptical polarization; and spiral polarization, and/or a sequence of laser pulses with some pulses within the train having a different polarization to other pulses within the train, or the like. The at least one laser may be configured to change the polarization of at least one pulse in the sequence of laser pulses. In an example, spiral polarization may be more effective than elliptical polarization, which itself may be more effective than linear polarization for generating smaller scatterers. It will be appreciated that any randomization of polarization may be beneficial.

Changing the polarization of the laser pulse may avoid a ripple formation in or adjacent to the at least one portion, which may emerge when near- and ablation-level femtosecond and/or picosecond pulses interact with materials with a relatively high concentration of electrons in the conducting band. Such ripples may have a periodicity that can deteriorate the characteristics of the return optical signal, which may decrease the quality of the information yielded by the at least one feature. The ripples may result in a periodic variation of extinction and/or refraction coefficients and/or thickness of the layer comprising carbon and/or modified carbon. The ripples may behave in a similar manner to a grating or other diffractive element, which may result in an arbitrary shift with respect to a diffractive pattern formed by the feature (which may be in the form of a grating). Such ripples may be the result of interaction of linearly polarized radiation with induced electron density waves (e.g. through polariton formation). The ripple formation process is described in Pan et al., "*Threshold Dependence of Deep-and Near-subwavelength Ripples Formation on Natural $MoS_2$ Induced by Femtosecond Laser*", *Scientific Reports* 6, 19571 (2016), which is incorporated herein by reference. The same mechanism (e.g. as described in Pan et al.) may lead to periodicity and/or larger size of the grains of the phase-changed material, thus any randomization of polarization, e.g. within at least one pulse (such as spiral polarization or the like) or between pulses (such as rotation of linear polarization from one pulse to another within a pulse train or changing to elliptical polarization, or the like) may be beneficial.

The energy delivery system may be configured to emit radiation and/or particles for pulsed heating of the at least one portion of the layer.

The energy delivery system may be configured to provide a fluence comparable with the fluence of the at least one laser. For example, the fluence may be in the range 0.01-1 $J/cm^2$ and/or the pulse duration may be less than 10 ns. It will be appreciated that the energy delivery system may be configured to provide a different fluence and/or pulse duration.

The energy delivery system may be configured to emit one or more of: an electron beam; an ion beam; a neutral beam; an extreme ultraviolet (EUV) beam in a range from 5 to 20 nm; and a beam comprising radiation having wavelengths in a range from 20 to 100 nm. The beam(s) may comprise radiation and/or particles.

The energy delivery system may be configured to emit radiation and/or particles to modify the at least one portion of the layer comprising metal.

The energy delivery system may be configured to modify the at least one portion of the layer comprising metal in the presence of a reactive medium so as to chemically convert the at least one portion of the layer to change the chemical composition of the at least one portion. The reactive medium may comprise gas and/or liquid, which may be sufficiently transparent for a beam of the energy delivery system.

The energy delivery system may comprise a laser configured to emit pulses with a duration of less than 100 ns, and optionally may be less than 10 ns, and optionally may be more than 10 fs.

The laser may be configured to deliver multiple pulses, and optionally wherein the pulse repetition rate may be at least 1 kHz, and optionally wherein the pulse repetition rate may be at least 1 MHz, and/or optionally wherein the duty cycle of the pulses may be less than 1%.

The laser may be configured to emit radiation with a fluence in the range 0.01-1 $J/cm^2$.

The energy delivery system may be configured to provide an ion beam to saturate the layer comprising metal with other atoms, ions or molecules to increase the transparency in the at least one portion of the layer comprising metal.

Laser irradiation for modification of the at least one portion may be replaced by or accompanied by localized exposure of the at least one portion to continuous wave and/or pulsed ion beams or plasma with total fluence of greater than 0.01 $J/cm^2$ and/or a pulse duration of less than 10 ns. The ions implanted by the localized exposure may leave a hot track in which pulsed heat and quenching may take place such that diamond and/or DLC phases of carbon may be produced. The ion beam energy may be greater than 1 eV, and optionally may be greater than 100 eV. The ions used may comprise at least one of: C-ions and/or B, N, O, Ga, He, Ne, Ar, Kr, Xe, and/or the like. The use of one or more of noble gas ions may promote outgassing and may leave the layer free of additional dopants.

The apparatus may comprise an electrical connection connected to the layer and configured to provide a voltage/current or ground connection so as to prevent charging of the layer. For example, if ions or electrons are directed to the substrate as part of the energy delivery system, the layer comprising carbon or metal may be connected to a source of voltage/current or grounded so as to prevent charging effects that may defocus or deflect a focused charged particle beam incident on the layer. This deflecting effect may be possible if the original (e.g. high extinction coefficient) layer is conducting.

The apparatus may be configured to use one or more noble gas ions to promote outgassing to leave the layer free of additional dopants, and optionally wherein the energy delivery system may be configured to direct ions or electrons to the substrate.

The energy delivery system may comprise an anodization system configured to provide an electric field potential between the layer comprising metal and an electrode for producing the electric field. The apparatus may be configured to provide a reactive medium for chemically converting the at least one portion of the layer to change the chemical composition of the at least one portion.

The apparatus may be configured to deposit a protective layer and/or clearout protective layer on the layer around the at least one portion of the layer. Alternatively, a separate apparatus may be used to deposit the protective layer and/or clearout protective layer on the layer prior to anodization.

The apparatus may comprise a liquid application system configured to provide an electrically conducting liquid between the at least one portion of the layer comprising metal and the electrode.

The apparatus may comprise a substrate support configured to support the substrate such that at least part of the substrate is not in contact with the conducting liquid. Alternatively or additionally, the apparatus may comprise an insulating layer applicator configured to apply an insulating layer on at least part the substrate to prevent contact between the part of the substrate and the conducting liquid.

The insulating layer may be removable (e.g. the insulating layer may temporarily mask part of the substrate from being exposed to the conducting liquid during the anodization process). The insulating layer may be removed when required, for example, once the anodization process is complete.

The anodization system may comprise an energy source connected to the metal layer and the electrode for producing the electric field therebetween. The energy source may be configured to provide continuous and/or pulsed voltage and/or current.

The energy source may comprise a voltage source that is electrically connected to the metal layer and the electrode with a polarity such that the metal layer forms an anode and the electrode forms a cathode.

The anodization system may be configured to perform electrochemical and/or photoelectrochemical anodization to modify the at least one portion of the layer comprising metal.

The at least one portion may be defined in a preceding litho-etch process via an opening in a protective layer provided or formed on top of the layer comprising metal.

The at least one portion may be defined by a focused beam of the energy delivery system.

The energy delivery system may be configured to modify the at least one portion of the layer comprising metal in the presence of a reactive medium so as to chemically, electrochemically and/or photoelectrochemically convert the at least one portion of the layer to change the chemical composition of the at least one portion.

The apparatus may comprise a chamber for containing the reactive medium.

The chamber may be configured to allow radiation and/or particles to interact with the layer comprising metal. The chamber may comprise a transparent section for allowing the radiation and/or particles to enter the chamber. The energy delivery system may be provided within the chamber.

The reactive medium may comprise a gas and/or liquid.

The reactive medium may comprise atoms, ions or molecules of at least one of: oxygen (O); oxide; hydrogen (H); boron (B); boride; carbon (C); carbide; nitrogen (N); nitride; chlorine (Cl); chloride; bromine (Br); bromide; fluorine (F); fluoride; iodine (I); iodide; silicon (Si); silicide;
phosphorous (P); phosphide.

The metal may comprise tungsten, or any other appropriate metal.

The energy delivery system may be configured to cause a change in the chemical composition of the layer comprising metal such that at least one atom, ion or molecule in the reactive medium is reacted with the metal to form a new chemical compound within the at least one portion.

The energy delivery system may be further configured to deliver UV, DUV and/or EUV radiation for breaking chemical bonds in the reactive medium.

The apparatus may comprise a debris removal system for removing from a surface of the layer debris generated during the modification. The debris removal system may comprise at least one of: an electric discharge; gas and/liquid flow; and reactive medium for removing the debris.

The apparatus may comprise a cooling system for contacting a gas and/or liquid with the substrate to remove heat therefrom. The cooling system may be configured to deliver the gas and/or liquid to at least the parts of the layer modified by the energy delivery system.

The apparatus may comprise an auxiliary layer deposition system for depositing a layer on the substrate. The auxiliary layer deposition system may be configured to deposit a protective layer, electro-insulating layer, BARC, and/or resist on the substrate and/or the layer comprising carbon or metal, and/or the other parts of the substrate.

The at least one portion of the opaque layer may be modified prior to the deposition of optional BARC and resist layers and patterning of the substrate in a litho tool.

The apparatus may comprise a layer deposition system. The layer deposition system may be operable to vary deposition conditions for the creation of at least one seed sub-layer in the layer, for example the layer comprising carbon. The seed sub-layer may comprise sp3-coordinated carbon for acting as seed sub-layer for nanodiamond nucleation and/or diamond-like carbon, DLC. The concentration of sp3 coordinated carbon atoms in the seed sub-layer may be higher than in other sub-layers.

The layer deposition system may be configured such that that for an opaque carbon layer, an extra layer with a relatively increased concentration of tetravalent carbon atoms, and thickness smaller than the layer may be provided as the seed sub-layer.

The layer deposition system may be configured such that structural modification of the layer comprising carbon may be used to increase transparency of a lower part of the layer deposited by a first deposition process, while an upper part of the layer may be provided after the modification by a second deposition process. The first and second deposition processes (and optionally any further deposition processes) may be performed by the layer deposition system.

The apparatus may comprise a layer removal system for removing material from the substrate. The layer removal system may comprise a litho-etch system configured such that material removed from the substrate corresponds to a location and size of the at least one feature. The layer removal system may comprise a chemical-mechanical polisher (CMP) device. The layer removal system may comprise an ablation system. The layer and/or material may be referred to as an auxiliary layer. The material may comprise the layer comprising metal or carbon, any of the layers deposited on the substrate, or may comprise any other part of the substrate.

The layer removal system may be configured to at least partially remove and/or planarize at least one of: a protective layer on the substrate, electro-insulating layer on the substrate, BARC and/or resist on the substrate. The layer may comprise carbon or metal and/or modified carbon or metal in the layer comprising carbon or metal.

The apparatus may further comprise a feedback control system. The feedback control system may be configured to determine one or more parameters of the at least one portion of the layer. The feedback control system may be configured to control the energy delivery system based on the one or more parameters. The parameters may comprise at least one of: dimensions, transparency, optical coefficients (e.g. refraction or extinction), scattering and the like.

The feedback control system may comprise a radiation sensor. The radiation sensor may be configured to receive radiation from the at least one portion of the layer. The feedback control system may be configured to determine the one or more parameters of the at least one portion of the layer based on the received radiation. The received radiation may comprise radiation reflected and/or scattered radiation generated by the energy delivery system.

The feedback control system may be configured to optimise the number and/or intensity of laser irradiating pulses and/or emission of particles by the energy delivery system. The feedback control system may be configured to stop and/or control the phase conversion when needed.

The feedback control system may comprise a control unit. The control unit may be configured to determine one or more of the parameters. The control unit may be operable to control any other part of the apparatus, for example, the energy delivery system, the radiation sensor, and the like. The feedback control system may be configured to regulate, control or otherwise vary the energy delivery system to control the modification of the at least one portion. The feedback control system may be operable to receive a signal, such as from a radiation sensor, indicating that the at least one portion has been sufficiently modified (e.g. made sufficiently transparent). The feedback control system may be operable to use the signal to determine whether to stop, or to continue, or vary the modification of the at least one portion.

The feedback control system may be configured to ensure that at least one layer below the layer comprising carbon may remain relatively unaffected by the modification of the at least one portion. For example, the energy delivery system may be controlled such that the generation of high pressure and/or temperature regions in the layer may be controlled following each of laser and/or particle pulses. Each subsequent pulse may propagate deeper into the layer comprising carbon. Each modified layer of the at least one portion may become more and more transparent with each pulse. The feedback control system may prevent at least one layer underlying the layer comprising carbon from being affected or substantially affected by the pulses.

The feedback control system may be configured such that at least one property of the return optical signal may be revealed by at least one of: reflected, scattered and/or diffracted optical signal from the at least one feature, which may be used to provide information regarding at least one layer of the substrate. Information such as polarization, wavelength(s), intensity, spectral intensity, an interference pattern, or the like, may be used to characterize at least one parameter such as thickness, optical length, refractive index 'n', extinction coefficient 'k', the composition, and/or the like of at least one layer in the substrate. At least one light source and/or the same radiation and/or particles as used for the modification may provide the optical signal and/or return optical signal. The amplitude and/or polarization of the light source and/or the radiation and/or particles provided by the energy delivery system may be attenuated and/or tuned for use in a metrology method, which may be used to determine the alignment of the substrate. The size of a metrology illumination spot of the optical signal for irradiating the at least one feature may substantially overlap with size of the modified portion in the layer, or may fit within the size of the modified portion.

The feedback control system may be configured such that at least one property of the optical signal for propagating through the substrate within the area of the modified at least one portion may be used to determine whether the at least one feature has been sufficiently illuminated, for example by back-illumination of the feature or in another illumination direction. The substrate may be illuminated, for example back-illuminated, with e.g. infrared or mid-infrared radiation (which may comprise wavelengths for which silicon is transparent) so that radiation may leak through the at least one portion once the DLC/diamond phase within the modified at least one portion is sufficiently thick and/or where the residual opacity of the layer comprising carbon may be sufficiently reduced. The feedback control system may be configured to monitor leakage of radiation (e.g. the infrared or mid-infrared radiation, or the like), and may be used to detect a moment to stop the modification of the at least one portion (for example, if the amount of radiation leaks exceeds a threshold level, or the like).

The feedback control system may be configured to monitor for plasma production or other forms of excitation of radiation by the energy delivery system. If plasma is produced or atoms/molecules are excited by at least one of the laser pulses and/or particles, optical spectroscopy or another technique may be used to sense the presence of the plasma or excitation, for example, if the diamond or DLC phase has modified the overall thickness of the layer comprising carbon.

The layer comprising carbon may attenuate or absorb radiation, for example from laser pulses, delivered by the energy delivery system, and/or may absorb particles delivered by the energy delivery system. The radiation and/or particles may initially modify an upper surface of the at least one portion of the layer. The upper surface may comprise an upper sub-layer of the layer. Modifying the upper sub-layer may cause the upper sub-layer to increase its transparency to the radiation and/or particles. The increased transparency of the upper sub-layer may provide a reduced attenuation/absorption to the radiation and/or particles such that if more radiation and/or particles are delivered (e.g. in the form a subsequent laser pulse or particle pulse), the radiation and/or particles may propagate through the modified upper sub-layer and modify a lower sub-layer beneath the upper sub-layer to cause an increase in transparency of at least one lower sub-layer(s). In an example, as each radiation and/or particle pulse modifies successive (e.g. lower) sub-layers within the layer, subsequent pulses may propagate deeper and deeper into the layer until the pulses may propagate all the way through the layer (e.g. through its overall thickness) to permit the pulses (and/or an optical signal) to access layer(s) of the substrate beneath the layer comprising carbon. Upon modification of the at least one portion of the layer, for example through the overall thickness of the layer, a pulse from the energy delivery system may propagate with little attenuation through the modified layer comprising carbon, which may cause at least one other chemical element or molecules (e.g. present in another layer and not present in the layer comprising carbon) of the substrate to be excited, which may cause the emission of a characteristic wavelength or spectrum, which may be an indication that the modification of the at least one portion is sufficient to permit the optical signal to propagate through the at least one portion. For example, it may be possible to distinguish between radiation emitted during modification of the layer comprising carbon and radiation (which may comprise at least one different wavelength to the radiation emitted during modification of the layer comprising carbon) emitted by the at least one other element of the substrate.

The feedback control system may be configured to characterise at least one property of radiation reflected, scattered, diffracted by the at least one portion. The feedback control system may comprise at least one of: a Raman detection system; a scanning electron microscope, or any other instrument for measuring a property of radiation reflected, scattered and/or diffractive by the feature. The Raman detection system may be configured to detect a Raman signal and/or a surface-enhanced Raman signal generated by the at least one portion, which may be used to characterise the at least one portion. The Raman detection system may be configured to provide information regarding the ratio of sp2/sp3 coordinated carbon atoms e.g. at the topmost layer of the modified at least one portion. A scanning electron microscope, or the like, may be used to characterise the at least one portion. By measuring the compression, indentation, or the like of the layer comprising carbon, it may possible to determine which part of the thickness of the layer comprising carbon has been phase converted.

The received radiation may comprise one or more of: the radiation from the energy delivery system reflected or scattered from the at least one portion of the layer; radiation that has propagated through the at least one portion of the layer and that has been emitted from a radiation source configured to backlight the semiconductor device substrate; radiation excited in the portion of the layer by radiation and/or particles from the energy delivery system; and radiation from an auxiliary light source, directed to and reflected and/or scattered from a spot that overlaps substantially with the portion of the layer that is modified by the energy delivery system. The radiation source may define a further radiation source configured to backlight the semiconductor device substrate. The radiation source may be configured to emit radiation and/or particles, which may be substantially transmissible through the substrate, but which may be substantially absorbed by the unmodified layer. The radiation source may comprise the auxiliary light source. The auxiliary light source may comprise a backlight for backlighting the semiconductor substrate.

The energy delivery system may be configured to emit radiation and/or particles for modifying the transparency of the at least one portion of the layer to a depth less than the overall thickness of the layer.

The apparatus may comprise a layer deposition system for depositing the layer on the substrate.

The layer deposition system may be configured to deposit a first sub-layer of the layer on the substrate. The energy delivery system may be operable to modify at least one portion in the first sub-layer.

The layer deposition system may be configured to deposit a second sub-layer of the layer on the first sub-layer after modification of the at least one portion of the first sub-layer.

The layer deposition system may be operable to vary deposition conditions for the creation of at least one seed sub-layer in the layer. The seed sub-layer may comprise sp3-coordinated carbon for acting as seed sub-layer for nanodiamond nucleation and/or diamond-like carbon, DLC, or the like. The concentration of sp3 coordinated carbon atoms in the seed sub-layer may be higher than in the other sub-layers.

The seed sub-layer may be thinner, for example more than 2×, more than 10×, or any other factor, thinner than the overall layer thickness.

The layer deposition system may be configured to deposit the at least one seed sub-layer at an upper surface of the layer. The layer deposition chamber or production method may be configured to convert the topmost part of the layer comprising carbon to a seed sub-layer, for example, by exposing the layer to energetic ions of, for example, noble gas.

The layer deposition system may be configured to subject a substrate to a sequence of procedures. The layer deposition system may be configured to deposit a layer comprising carbon on the substrate, which may comprise 50 to 100% of the overall thickness of the layer. It will be appreciated that a different thickness may be deposited before modification of the layer. The apparatus may be configured to modify the at least one portion of the layer above some or all of the features in the substrate to reduce the extinction coefficient of the at least one portion. The apparatus may be configured such that an area of the at least one portion is 0.1-10 times the area of the corresponding feature, and may substantially overlap with the corresponding feature. The apparatus may be configured to modify only part of the thickness of the layer so the thickness of the layer with reduced extinction coefficient may be less than or equal to the thickness of the initial layer.

The layer deposition system and/or a manufacturing procedure may be configured to perform a chemical-mechanical polishing (CMP) step (e.g. using a chemical-mechanical polisher, or the like) for at least one of: planarizing; and removing debris particles, which may result from ablation plumes or the like, from a surface of the substrate. The layer deposition system may be configured to apply a removable layer (e.g. via spin coating, or the like) prior to the modification of the at least one portion. The removable layer may be removed (e.g. by washing or the like) to remove deposited debris particles e.g. once at least one feature in the substrate becomes visible after the modification of the at least one portion.

The CMP may be used to reduce or eliminate any ripples formed in the surface of the substrate and/or at the edge of the at least one modified portion. Alternatively or additionally, the CMP may be used to remove debris particles.

The layer deposition system may be configured to deposit a remainder of the overall thickness of the layer e.g. after modification of the at least one portion. For example, 0 to 50%, or any other percentage range, of the overall layer thickness may be deposited, depending on the initial thickness deposited.

The layer deposition system may be configured to deposit at least one of: a bottom anti-reflection coating (BARC); resist; and any other layer on the substrate. The layer deposition system may be configured such that the BARC and/or resist deposition may be relatively uniform or planar. There may be a difference in the wetting of DLC/diamond and amorphous carbon by BARC and/or resist. Depositing a layer of amorphous carbon or the like, e.g. a relatively thin layer that may permit penetration of the relatively thin layer by the optical signal, may reduce the difference in the wetting properties of BARC and/or resist, or the like.

The layer deposition system may be configured to deposit the layer comprising carbon such that an unmodified portion of the layer may be above or below at least one modified portion of the layer, which may provide a layer having at least one modified portion nearer to the upper surface of the layer, or nearer to the lower surface of the layer (e.g. which may be in contact with an underlying layer of the substrate). Providing an unmodified layer below the modified portion may ensure that a user-specified ashing recipe for the layer may be used.

The apparatus may comprise a debris removal system for removing from a surface of the layer debris particles generated during the modification.

Modifying the layer in a vacuum or at low pressure may reduce or eliminate debris particle deposition on a surface of the substrate. Examples of pressure conditions for reducing or eliminating debris particle deposition are described in Harilal et al. *"Background gas collisional effects on expanding fs and ns laser ablation plumes"*, Appl. Phys. A, Vol. 117(1), pp. 319-326 (2014), which is incorporated herein by reference.

The debris removal system may comprise a radiation source for emitting radiation for irradiating the debris particles formed in an ablation plume during modification of the least one portion of the layer for reducing the debris particle size and/or a number of debris particles in the ablation plume.

The debris removal system may be configured to irradiate the ablation plume with at least one laser pulse, for example in the form of an after-pulse, or the like. The laser pulse may have a lower energy and/or peak fluence than the radiation and/or particles for modifying the at least one portion.

The laser pulse may have a duration of less than 10 ns, less than 0.1 ns, or any other appropriate pulse duration. The laser pulse may be configured to follow each or some of the pulses for modifying the at least one portion, for example, with a delay of less than 10 µs, less than 1 µs, or any other appropriate delay. The after-pulse may effectively be absorbed by particles in the ablation plasma plume, which may evaporate the particles or at least reduce their size to less than or much less than 100 nm such that the particles do not get imaged or deteriorate yield even if left on the substrate.

The debris removal system may comprise an electric discharger for generating a plasma above the at least one portion of the layer during modification thereof. The plasma may be configured to capture charged particles (e.g. which may be produced and/or charged in the ablation plume and may prevent their re-deposition). Alternatively or in addition, the apparatus may be configured to apply a bias to the substrate comprising the layer, such that an electric field may repel charged particles produced in the ablation plume from the substrate and/or may prevent re-deposition of the charged particles.

Maintaining an electric discharge above the layer during modification may be performed such that moderate temperature ions may be generated. For example, ions such as Titanium ions may be generated with an energy of less than 100 eV, and optionally less than 10 eV. Particles generated within an ablation plasma plume may be generally negatively charged, which may result in the negative particles being retained in the positive potential of the plasma and may prevent their re-deposition on the substrate.

The debris removal system may be configured to incline the semiconductor device substrate, such that the debris particles may move away from the layer under force of gravity, or by any other external force or pressure. The substrate may be inclined during modification of the at least one portion such that gravity may move the debris particles away from the layer.

The debris removal system may be configured to apply a removable layer to a surface of the layer, wherein the debris particles may be collected on the removable layer. The debris removal system may be further configured to remove the removable layer after modification of the at least one portion of the layer.

The debris removal system may be configured to remove the removable layer at the location of the at least one portion of the layer before the energy delivery system emits the radiation and/or particles.

The debris removal system may be configured to provide a reactive medium in proximity to the at least one portion of the layer, for example, such that only the products of reaction of material within the ablation plume may be substantially volatile or soluble. The reactive medium may be gas or liquid. The reactive medium may be transparent to the radiation and/or particles. The activation energy may be provided by the high temperature within the plume and/or by direct photo-excitation by the radiation and/or particles. The reactive medium may be configured to convert vapour or particles in the plasma plume to the volatile or soluble form, which may be subsequently removed by diffusion and/or flow.

The modification of the at least one portion may be performed in the reactive medium. The reactive medium may comprise at least one of: oxygen, hydrogen, halogens, air, water vapour, liquid water, $CO_2$ (e.g. gas or liquid) or the like. The reactive medium may be configured to turn into volatile or soluble oxides, halides and the like e.g. so as to eliminate the debris particles which may be generated in an ablation plume. Debris particles may react within the ablation plume with reactive medium, which may be in the form of a gas or liquid, and form volatiles or soluble particles/molecules that can be removed by flow and/or diffusion. The debris particles may be condensed from the high density vapour or be produced in the liquid form, and/or may comprise carbon, tungsten, boron, nitrogen and/or any other elements.

The apparatus may further comprise a chamber configured to hold a liquid or gas. The semiconductor device substrate may be at least partially immersed in the liquid or gas at least during emission of the radiation and/or particles by the energy delivery system.

The modification of the at least one portion may be performed in liquid (e.g. water, alcohol, liquid carbon dioxide, perfluorinated fluids, heat transfer fluids, or the like). The substrate may be at least partially immersed in a bath and/or have a liquid film applied (e.g. which may comprise a condensation, or the like) on the surface thereof.

Performing the modification in liquid may allow the thermal stress upon wafer to be reduced. The liquid may act to provide a heat sink by conduction and/or evaporation and/or dissociation. The liquid may act to improve quenching (e.g. so carbon may be heated up to circa. 4000 to 5000° C., or any other potential or appropriate temperature), and then may be quickly cooled to preserve the diamond or DLC phase.

Performing the modification of the at least one portion of the substrate immersed in the liquid may suppress or prevent removal of carbon (e.g. and other elements) by a Coulomb explosion and/or evaporation process, which may be useful for maintaining the layer resistance to a subsequent etching step or maintaining the layer thickness (e.g. by minimizing the difference between modified and unmodified portions within the layer), which may eliminate the need to perform a planarization step and/or may reduce the difference in wetting/distribution for the steps of application of BARC and/or resist.

The apparatus may comprise a liquid film applicator configured to apply a liquid film to a surface of the layer before the energy delivery system emits the radiation and/or particles.

The apparatus may comprise an optical system configured to transmit an optical signal through the at least one portion of the layer for determining information relating to the at least one feature.

The optical system may comprise any appropriate instrument for determining information relating to the at least one feature. The optical system may be configured to receive an optical signal reflected, scattered and/or diffracted from the at least one feature such that information relating to the at least one feature can be determined. The optical system may be configured to provide the optical signal for propagating the modified at least one portion.

The apparatus may comprise a substrate alignment system for determining information relating to the at least one feature based on a return optical signal received through the at least one portion of the layer.

The at least one feature may be irradiated by the optical signal, which may initially propagate through the at least one portion. The optical signal may interact (e.g. reflect, scatter and/or diffract) with the at least one feature to form a return optical signal, which may subsequently propagate through the at least one portion. The at least one feature may be irradiated by the optical signal, which may not initially propagate through the at least one portion. For example, the at least one feature may be irradiated by the optical signal arriving from at least one different direction such that the optical signal may not initially pass through the at least one portion. The return optical signal may subsequently propagate through the at least one portion.

The substrate alignment system may be configured to determine at least one of: the presence; position and orientation, or the like, of the at least one feature in order to determine whether the substrate is aligned.

The substrate alignment system may be configured to control the relative positioning between the substrate and a lithography apparatus or lithographic tool to align the substrate therein.

The optical system and/or the substrate alignment system may comprise any appropriate instrument for at least one of: measuring; and analysing information obtained from the at least one feature. Examples of techniques for determining information relating to the at least one feature may comprise at least one of: using a Smart Alignment Sensor Hybrid (SMASH) system such as produced by the applicant of the present disclosure and/or a phase-grating alignment technique such as produced by the applicant of the present disclosure and/or an interferometric technique that uses a return optical signal from the at least one feature to determine the information. The SMASH system may not require a full area of the at least one feature to be visible (e.g. if the area of the modified portion is less than the area of the corresponding feature) and/or well illuminated by the optical signal to determine the information. The SMASH system may be operable in the visible and/or infrared spectral ranges. The wavelength(s) used by the SMASH system or any other instrument may at least partially penetrate the layer comprising carbon, for example, if part of the layer is obscuring the at least one feature. Selection of appropriate wavelengths may permit the optical signal provided by the SMASH system or any other appropriate instrument to penetrate the layer, even if the layer has not been completely modified through its overall thickness, or if the modification is incomplete such that the modified layer thickness is less than its overall thickness, and/or if any other layers have been deposited on the substrate.

The feature may comprise an alignment or overlay mark, or the like.

The modified layer may comprise at least 20% carbon, or optionally may comprise at least 50% carbon.

The energy delivery system for phase-changing a layer comprising carbon may, in principle, be capable of changing the chemical composition of an opaque metal layer (e.g. locally) to increase its optical transparency. The availability of reagents (for example, reactive medium in contact with at least a portion of the metal comprising layer) may affect the change of chemical composition.

The optimal properties of the energy delivery system for local metal layer chemical conversion may be different than the properties for carbon layer structural modification. However, there may be some similarities between the parameters used. For example, an energy delivery system with an energy (e.g. laser) pulse duration of $\ll 1$ ns and fluence in the range 0.01-1 $J/cm^2$ may be used to modify the metal layer, since these parameters may provide a high temperature and/or pressure.

The energy delivery system may be configured to catalyse generation of oxide, boride, nitride, or the like, (e.g. to form metal-oxide, metal-boride, metal-nitride, or the like) and may facilitate inter-diffusion of the newly formed substance or composition with underlying metal. There may be the same or similar propagation of chemically changed metal through the metal layer as may occur in the case of the phase-changed material (e.g. diamond, DLC, or the like) propagating through a carbon layer, as described herein.

Thus, the apparatus and methods described herein that are relevant for carbon layer local structural change may also at least partially be applicable to metal layer local chemical change.

Alternatively or additionally to providing an energy delivery system capable of providing a focused beam of energy, the energy delivery system may be configured to provide electro-chemical conversion of metal, which may provide a relatively deep (e.g. up to few μm, or the like) conversion of metal to metal-oxide, metal-nitride, metal-boride, or the like. The local nature of conversion may be provided either by preceding deposition/litho-etch of an insulating layer (that may prevent contact between reagents and the metal layer in the regions different than the features buried within the substrate) and/or by catalysing of electro-chemical conversion by the focused beam of energy delivery system. Such a system may be able to increase the speed of metal conversion (e.g. above the buried feature) some 10-1000×, or the like; thus a locally converted layer may be provided with increased transparency, while the rest of the layer (which may be subject to a relatively slow, pure electro-chemical anodization) may only be slightly affected (with a minimal or negligible change to its transparency over the same timeframe). The anodized layer (which may be relatively thin) may be removed via CMP, or the like.

According to an example of the present disclosure there is provided a lithography apparatus comprising the apparatus of any example of the present disclosure.

According to an example of the present disclosure there is provided a lithographic tool comprising the apparatus of any example of the present disclosure.

According to an example of the present disclosure there is provided a method for determining information relating to at least one feature in a semiconductor device substrate. The at least one feature may be at least partially obscured by a layer comprising carbon, such that an optical signal for determining information relating to the at least one feature may be prevented from reaching the feature. The at least one feature may be at least partially obscured by a layer comprising metal, such that an optical signal for determining information relating to the at least one feature may be prevented from reaching the feature. The method may comprise: modifying, by an energy delivery system, at least one portion of the layer to increase its transparency. The at least one portion of the layer may be opaque such that the modification may increase its transparency by inducing a phase change and/or chemical composition change in the at least one portion. Modifying the at least one portion may be such that at least part of the optical signal for determining the information relating to the at least one feature can propagate through the at least one portion of the layer for determining the information relating to the at least one feature.

The method may comprise using the energy delivery system to emit a beam to modify the at least one portion of the layer by reducing the extinction coefficient of the at least one portion of the layer e.g. by changing the valence state of some of the carbon atoms within the layer (e.g. increasing the content of sp3-coordinated carbon atoms and/or reducing the content of sp2 coordinated carbon atoms).

The beam may comprise the radiation and/or particles.

The method may comprise using the energy delivery system to emit a beam to modify the at least one portion of the layer by causing a phase change in the carbon (e.g. at the at least one portion of the layer) and/or causing an increase in the concentration of sp3-coordinated carbon atoms (e.g. tetravalent carbon atoms) at the at least one portion of the layer.

The method may comprise modifying the carbon at the at least one portion of the layer such that the carbon forms at least one of: diamond; and diamond-like carbon.

The method may comprise using the energy delivery system to induce local chemical composition change to modify the at least one portion of the layer by reducing the extinction coefficient and/or refraction coefficient and reducing/eliminating concentration and total number of electrons in the conducting zone. The energy delivery system may be configured to emit a beam of radiation and/or particles. Alternatively or additionally, the energy delivery system may comprise an anodization system for inducing local chemical composition change to modify the at least one portion of the layer.

The method may comprise using at least one laser to emit the radiation and/or particles. The method may comprise using at least one laser for emitting the radiation and/or at least one source of a focused beam of energetic particles.

The method may comprise using a pulsed laser source to emit a series of laser pulses.

The method may comprise emitting radiation having at least one wavelength in a range from 4 nm to 3 µm.

The method may comprise using the at least one laser to emit one or more of: visible and/or infrared laser pulses with a pulse duration in a range from 5 fs to 500 ps; ultraviolet laser pulses with a pulse duration in the range 1 ps to 500 ns; soft X-ray to DUV laser pulses with a pulse duration in the range 1 fs to 100 ns, or the like.

The method may comprise using the at least one laser to emit an initial pulse train comprising at least one laser pulse of a first pulse duration. The method may further comprise emitting a subsequent pulse train comprising at least one laser pulse of a shorter, second pulse duration.

The method may comprise using the at least one laser to emit radiation having a peak radiant fluence or intensity of radiation below an ablation threshold for the layer.

The method may comprise using the at least one laser to emit radiation and/or particles having at least one of: a linear polarized radiation; non-linear polarized radiation; elliptical polarized radiation; and spiral polarized radiation.

The method may comprise using the at least one laser to emit a sequence of laser pulses, each laser pulse having one of: linear polarization; circular polarization; elliptical polarization; spiral polarization and/or a sequence of laser pulses with some pulses within the train having a different polarization to other pulses within the train.

The method may comprise emitting, by the energy delivery system, radiation and/or particles for pulsed heating of the at least one portion of the layer.

The method may comprise using the energy delivery system to emit one or more of: an electron beam; an ion beam; a neutral beam; an extreme ultraviolet (EUV) beam in a range from 5 to 20 nm; and a beam comprising radiation having wavelengths in a range from 20 to 100 nm. The beam(s) may comprise radiation and/or particles.

The method may comprise emitting radiation and/or particles to modify the at least one portion of the layer comprising metal.

The method may comprise modifying the at least one portion of the layer comprising metal in the presence of a reactive medium so as to chemically convert the at least one portion of the layer to change the chemical composition of the at least one portion. The reactive medium may comprise gas and/or liquid, which may be sufficiently transparent for a beam of the energy delivery system.

The energy delivery system may comprise a laser configured to emit pulses with a duration of less than 100 ns, and optionally may be less than 10 ns, and optionally may be more than 10 fs.

The laser may be configured to deliver multiple pulses, and optionally wherein the pulse repetition rate may be at least 1 kHz, and optionally wherein the pulse repetition rate may be at least 1 MHz, and/or optionally wherein the duty cycle of the pulses may be less than 1%.

The laser may be configured to emit radiation with a fluence in the range 0.01-1 J/cm$^2$.

The energy delivery system may be configured to provide an ion beam to saturate the layer comprising metal with other atoms, ions or molecules to increase the transparency in the at least one portion of the layer comprising metal.

The method may use laser irradiation for modification of the at least one portion, which may be replaced by or accompanied by localized exposure of the at least one portion to continuous wave and/or pulsed ion beams or plasma with total fluence of greater than 0.01 J/cm$^2$ and/or a pulse duration of less than 10 ns. The ions implanted by the localized exposure may leave a hot track in which pulsed heat and quenching may take place such that diamond and/or DLC phases of carbon may be produced. The ion beam energy may be greater than 1 eV, and optionally may be greater than 100 eV. The ions used may comprise at least one of: C-ions and/or B, N, O, Ga, He, Ne, Ar, Kr, Xe, and/or the like. The method may comprise using of one or more of noble gas ions may promote outgassing and may leave the layer free of additional dopants.

The method may comprise connecting an electrical connection to the layer, the electrical connection being configured to provide a voltage/current or ground connection so as to prevent charging of the layer. For example, if ions or electrons are directed to the substrate as part of the energy delivery system, the method may comprise connecting the layer comprising carbon to a source of voltage/current or grounded so as to prevent charging effects that may defocus or deflect a focused charged particle beam incident on the layer. This deflecting effect may be possible if the original (e.g. high extinction coefficient) layer is conducting.

The method may comprise using one or more noble gas ions to promote outgassing to leave the layer free of additional dopants. The method may comprise directing ions or electrons to the substrate.

The energy delivery system may comprise an anodization system configured to provide an electric field potential between the layer comprising metal and an electrode for producing the electric field. The method may comprise providing a reactive medium for chemically converting the at least one portion of the layer to change the chemical composition of the at least one portion.

The method may comprise depositing a protective layer and/or clearout protective layer on the layer around the at least one portion of the layer. Depositing the protective layer and/or clearout protective layer may be performed using same or separate apparatus prior to anodization.

The method may comprise providing, with a liquid application system, an electrically conducting liquid between the at least one portion of the layer comprising metal and the electrode.

The method may comprise supporting, with a substrate support, the substrate such that at least part of the substrate is not in contact with the conducting liquid. Alternatively or additionally, the method may comprise applying, with an insulating layer applicator, an insulating layer on at least part of the substrate to prevent contact between the part of the substrate and the conducting liquid. The method may comprise removing the insulating layer, for example, once the anodization process is complete.

The method may comprise connecting an energy source to the metal layer and the electrode for producing the electric field therebetween. The energy source may be configured to provide continuous and/or pulsed voltage and/or current.

The energy source may comprise a voltage source that is electrically connected to the metal layer and the electrode with a polarity such that the metal layer forms an anode and the electrode forms a cathode.

The method may comprise performing electrochemical and/or photoelectrochemical anodization to modify the at least one portion of the layer comprising metal.

The method may comprise defining at least one portion in a preceding litho-etch process via an opening in a protective layer provided or formed on top of the layer comprising metal.

The at least one portion may be defined by a focused beam of the energy delivery system.

The method may comprise modifying the at least one portion of the layer comprising metal in the presence of a reactive medium so as to chemically, electrochemically and/or photoelectrochemically convert the at least one portion of the layer to change the chemical composition of the at least one portion.

The method may comprise providing a chamber for containing the reactive medium.

The chamber may be configured to allow radiation and/or particles to interact with the layer comprising metal. The chamber may comprise a transparent section for allowing the radiation and/or particles to enter the chamber. The energy delivery system may be provided within the chamber.

The reactive medium may comprise a gas and/or liquid.

The reactive medium may comprise atoms, ions or molecules of at least one of: oxygen (O); oxide; hydrogen (H); boron (B); boride; carbon (C); carbide; nitrogen (N); nitride; chlorine (Cl); chloride; bromine (Br); bromide; fluorine (F); fluoride; iodine (I); iodide; silicon (Si); silicide; phosphorous (P); phosphide.

The metal may comprise tungsten, or any other appropriate metal.

The method may comprise causing a change in the chemical composition of the layer comprising metal such that at least one atom, ion or molecule in the reactive medium is reacted with the metal to form a new chemical compound within the at least one portion.

The method may comprise delivering UV, DUV and/or EUV radiation for breaking chemical bonds in the reactive medium.

The method may comprise providing a debris removal system for removing from a surface of the layer debris generated during the modification. The debris removal system may comprise at least one of: an electric discharge; gas and/liquid flow; and reactive medium for removing the debris.

The method may comprise providing a cooling system for contacting a gas and/or liquid with the substrate to remove heat therefrom. The cooling system may be configured to deliver the gas and/or liquid to at least the parts of the layer modified by the energy delivery system.

The method may comprise providing an auxiliary layer deposition system for depositing a layer on the substrate. The auxiliary layer deposition system may be configured to deposit a protective layer, electro-insulating layer, BARC, and/or resist on the substrate and/or the layer comprising carbon or metal, and/or the other parts of the substrate.

The method may comprise modifying the at least one portion of the opaque layer prior to the deposition of optional BARC and resist layers and patterning of the substrate in a litho tool.

The method may comprise providing a layer deposition system. The layer deposition system may be operable to vary deposition conditions for the creation of at least one seed sub-layer in the layer, for example the layer comprising carbon. The seed sub-layer may comprise sp3-coordinated carbon for acting as seed sub-layer for nanodiamond nucleation and/or diamond-like carbon, DLC. The concentration of sp3 coordinated carbon atoms in the seed sub-layer may be higher than in other sub-layers.

The method may comprise providing, for an opaque carbon layer, an extra layer with a relatively increased concentration of tetravalent carbon atoms, and thickness smaller than the layer to act as the seed sub-layer.

The method may comprise using the layer deposition system to deposit a lower part of the layer by a first deposition process and depositing an upper part of the layer by a second deposition process. The layer deposition system may be configured such that structural modification of the layer comprising carbon may be used to increase transparency of a lower part of the layer deposited by the first deposition process, while an upper part of the layer may be provided after the modification by the second deposition process. The first and second deposition processes (and optionally any further deposition processes) may be performed by the layer deposition system.

The method may comprise removing, with a layer removal system, material from the substrate. The layer removal system may comprise a litho-etch system configured such that material removed from the substrate corresponds to a location and size of the at least one feature. The layer removal system may comprise a chemical-mechanical polisher (CMP) device. The layer removal system may comprise an ablation system. The layer and/or material may be referred to as an auxiliary layer. The material may comprise the layer comprising metal or carbon, any of the layers deposited on the substrate, or may comprise any other part of the substrate.

The layer removal system may be configured to at least partially remove and/or planarize at least one of: a protective layer on the substrate, electro-insulating layer on the substrate, BARC and/or resist on the substrate. The layer may comprise carbon or metal and/or modified carbon or metal in the layer comprising carbon or metal.

The method may comprise providing a current or bias voltage source, or grounding the layer comprising carbon to avoid charge build up provided by a charged particle beam.

The method may comprise using a feedback control system configured to determine one or more parameters of the at least one portion of the layer and to control the energy delivery system based on the one or more parameters.

The method may comprise using a radiation sensor of the feedback control system to receive radiation from the at least one portion of the layer. The method may comprise using the feedback control system to determine the one or more parameters of the at least one portion of the layer based on the received radiation.

The received radiation may comprise one or more of:

the radiation from the energy delivery system reflected or scattered from the at least one portion of the layer; radiation that has propagated through the at least one portion of the layer and that has been emitted from a radiation source configured to backlight the semiconductor device substrate; radiation excited in the portion of the layer by radiation and/or particles from the energy delivery system; and radiation from an auxiliary light source, directed to and reflected and/or scattered from a spot that overlaps substantially with the portion of the layer that is modified by the energy delivery system.

The method may comprise using the energy delivery system to emit radiation and/or particles to modify the transparency of the at least one portion of the layer to a depth less than the overall thickness of the layer.

The method may comprise using a layer deposition system to deposit the layer on the substrate.

The method may comprise using the layer deposition system to deposit a first sub-layer of the layer on the substrate. The method may comprise using the energy delivery system to modify at least one portion in the first sub-layer.

The method may comprise using the layer deposition system to deposit a second sub-layer of the layer on the first sub-layer after modification of the at least one portion of the first sub-layer. Any number of sub-layers may be deposited using the layer deposition system. Each sub-layer may have any appropriate composition e.g. dopants, impurities, other forms of carbon, or the like.

The method may comprise using the layer deposition system to vary deposition conditions to create at least one seed sub-layer in the layer. The seed sub-layer may comprise (e.g. an increased amount of) sp3-coordinated carbon for acting as seed sub-layer for nanodiamond nucleation and/or diamond-like carbon, DLC, or the like.

The method may comprise using the layer deposition system to deposit the at least one seed sub-layer at an upper surface of the layer. The method may comprise a means to convert a portion of the topmost layer to the seed sub-layer.

The method may comprise using a debris removal system to remove from a surface of the layer debris particles generated during the modification.

Using the debris removal system may comprise using a radiation source to emit radiation for irradiating the debris particles formed in an ablation plume during modification of the least one portion of the layer to reduce the debris particle size and/or a number of debris particles in the ablation plume.

The method may comprise using an electric discharge, for example generated by an electric discharger, to generate a plasma above the at least one portion of the layer during modification thereof. The plasma may be configured to capture particles (e.g. which may be produced and/or charged in the ablation plume and may prevent their re-deposition). Alternatively or in addition, the method may comprise applying a bias to the substrate comprising the layer, such that an electric field may repel charged particles produced in the ablation plume from the substrate and/or may prevent re-deposition of the charged particles.

The method may comprise using the debris removal system to incline the semiconductor device substrate, such that the debris particles may move away from the layer under force of gravity.

The method may comprise using the debris removal system to apply a removable layer to a surface of the layer. The debris particles may be collected on the removable layer. The method may comprise using the debris removal system to remove the removable layer after modification of the at least one portion of the layer.

The method may comprise using the debris removal system to remove the removable layer at the location of the at least one portion of the layer before the energy delivery system emits the radiation and/or particles.

The method may comprise using the debris removal system to provide a reactive medium in proximity to the at least one portion of the layer, for example, such that only the products of reaction of material within the ablation plume may be substantially volatile or soluble. The reactive medium may be gas or liquid. The reactive medium may be transparent to the radiation and/or particles. The activation energy may be provided by the high temperature within the plume and/or by direct photo-excitation by the radiation and/or particles. The reactive medium may convert vapour or particles in the plasma plume to the volatile or soluble form, which may be subsequently removed by diffusion and/or flow.

The method may comprise providing a chamber configured to hold a liquid, at least partially immersing the semiconductor device substrate in the liquid at least during emission of the radiation and/or particles by the energy delivery system.

The method may comprise using a liquid film applicator to apply a liquid film to a surface of the layer before the energy delivery system emits the radiation and/or particles.

The method may comprise using an optical system to transmit an optical signal through the at least one portion of the layer to determine information relating to the at least one feature.

The method may comprise using a substrate alignment system to determine information relating to the at least one feature based on a return optical signal received through the at least one portion of the layer.

The method may comprise using the substrate alignment system to determine at least one of: the presence; position and orientation of the at least one feature in order to determine whether the substrate is aligned.

The method may comprise using the substrate alignment system to control the relative positioning between the substrate and a lithography apparatus or lithographic tool to align the substrate therein.

According to an example of the present disclosure there is provided a computer program. The computer program may comprise instructions which, when executed on at least one processor, may cause the at least one processor to control an apparatus to carry out the method according to any example of the present disclosure.

According to an example of the present disclosure there is provided a carrier. The carrier may contain the computer program of any example of the present disclosure. The carrier may be one of an electronic signal, optical signal, radio signal, non-transitory computer readable storage medium, or the like.

At least one feature of any example, aspect or embodiment of the present disclosure may replace any corresponding feature of any example, aspect or embodiment of the present disclosure. At least one feature of any example, aspect or embodiment of the present disclosure may be combined with any other example, aspect or embodiment of the present disclosure.

BRIEF DESCRIPTION OF THE DRAWINGS

Embodiments of the present disclosure will now be described, by way of example only, with reference to the accompanying schematic drawings, in which.

DETAILED DESCRIPTION OF THE DRAWINGS

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text, unless stated otherwise, may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. More information on such mirror arrays is given in U.S. Pat. Nos. 5,296,891 and 5,523,193, which are incorporated herein by reference.

a programmable LCD array. An example of such a construction is given in U.S. Pat. No. 5,229,872, which is incorporated herein by reference.

Figure 1:
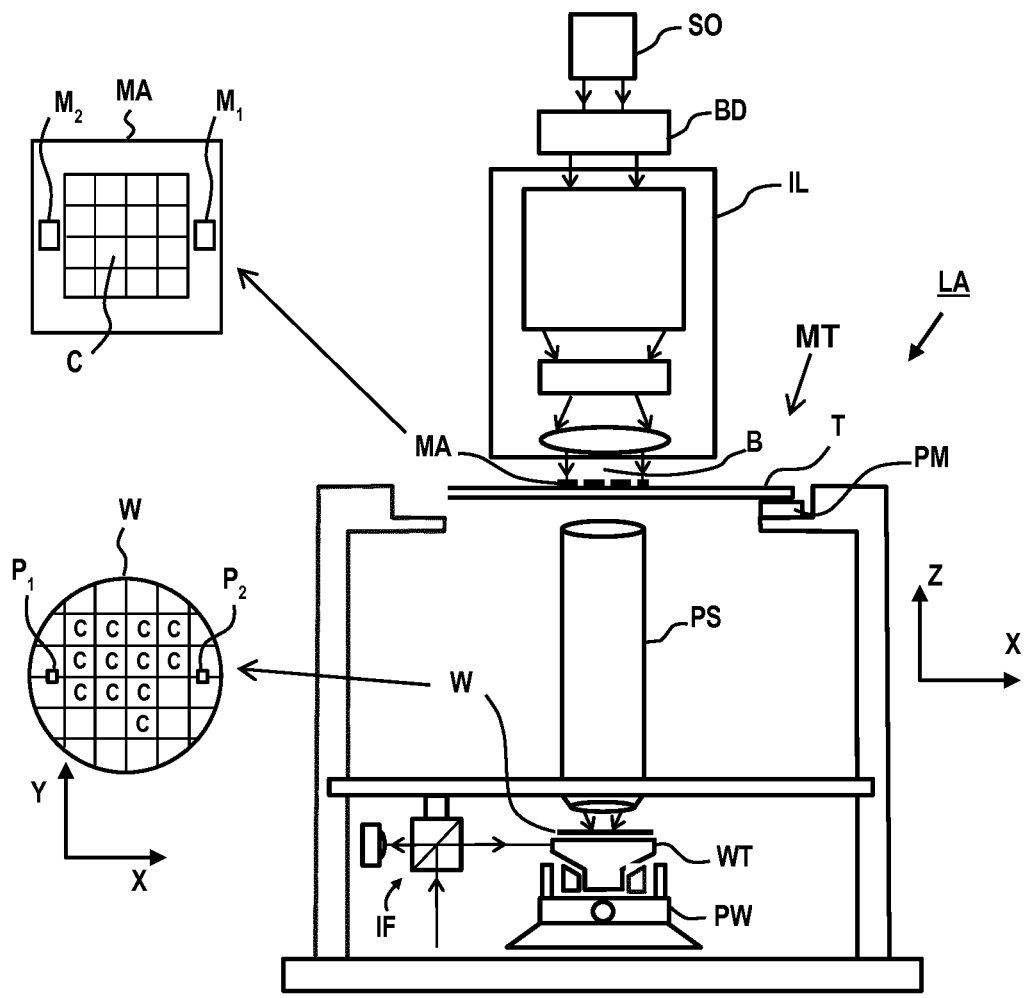
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support structure (e.g., a mask table) MT constructed to support a patterning device (e.g., a mask) MA and connected to a first positioner PM configured to accurately position the patterning device MA in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illuminator IL receives a radiation beam from a radiation source SO, e.g. via a beam delivery system BD. The illumination system IL may include various types of optical components, such as refractive, reflective, magnetic, electromagnetic, electrostatic, or other types of optical components, or any combination thereof, for directing, shaping, or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by a liquid having a relatively high refractive index, e.g., water, so as to fill a space between the projection system and the substrate—which is also referred to as immersion lithography. More information on immersion techniques is given in U.S. Pat. No. 6,952,253 and in PCT publication No. WO99-49504, which are incorporated herein by reference.

The lithographic apparatus LA may also be of a type having two (dual stage) or more substrate tables WT and, for example, two or more support structure MT (not shown). In such "multiple stage" machines the additional tables/structures may be used in parallel, or preparatory steps may be carried out on one or more tables while one or more other tables are being used for exposing the design layout of the patterning device MA onto the substrate W.

In operation, the radiation beam B is incident on the patterning device (e.g., mask MA), which is held on the support structure (e.g., mask table MT), and is patterned by the patterning device MA. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and possibly another position sensor (which is not explicitly depicted in FIG. 1) may be used to accurately position the mask MA with respect to the path of the radiation beam B. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Figure 2:
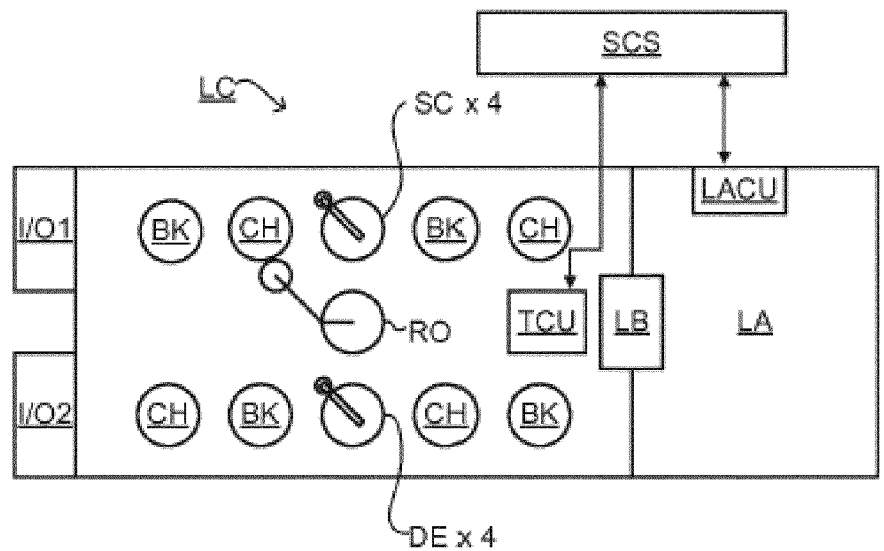
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

The lithographic apparatus LA is configured to accurately reproduce the pattern onto the substrate. The positions and dimensions of the applied features need to be within certain tolerances. Position errors may occur due to an overlay error (often referred to as "overlay"). The overlay is the error in placing a first feature during a first exposure relative to a second feature during a second exposure. The lithographic apparatus minimizes the overlay errors by aligning each wafer accurately to a reference prior to patterning. This is done by measuring positions of alignment marks on the substrate using an alignment sensor. More information on the alignment procedure can be found in U.S. Patent Application Publication No. US20100214550, which is incorporated herein by reference. Pattern dimensioning (CD) errors may e.g. occur when the substrate is not positioned correctly with respect to a focal plane of the lithographic apparatus. These focal position errors may be associated with un-flatness of a substrate surface. The lithographic apparatus minimizes these focal position errors by measuring the substrate surface topography prior to patterning using a level sensor. Substrate height corrections are applied during subsequent patterning to assure correct imaging (focusing) of the patterning device onto the substrate. More information on the level sensor system can be found in U.S. Patent Application Publication No. US20070085991, which is incorporated herein by reference.

Besides the lithographic apparatus LA and the metrology apparatus MT other processing apparatus may be used during IC production as well. An etching station (not shown) processes the substrates after exposure of the pattern into the resist. The etch station transfers the pattern from the resist into one or more layers underlying the resist layer. Typically etching is based on application of a plasma medium. Local etching characteristics may e.g. be controlled using temperature control of the substrate or directing the plasma medium using a voltage controlled ring. More information on etching control can be found in international Patent Application Publication No. WO2011081645 and U.S. Patent Application Publication No. US 20060016561 which are incorporated herein by reference.

During the manufacturing of the ICs the process conditions for processing substrates using processing apparatus such as the lithographic apparatus or etching station may remain stable such that properties of the features remain within certain control limits. Stability of the process may be relevant for features of the functional parts of the IC, the product features. To ensure stable processing, process control capabilities need to be in place. Process control involves monitoring of processing data and implementation of means for process correction, e.g. control the processing apparatus based on characteristics of the processing data. Process control may be based on periodic measurement by the metrology apparatus MT, often referred to as "Advanced Process Control" (further also referenced to as APC). More information on APC can be found in U.S. Patent Application Publication No. US20120008127, which is incorporated herein by reference. A typical APC implementation involves periodic measurements on metrology features on the substrates to monitor and correct drifts associated with one or more processing apparatus. The metrology features reflect the response to process variations of the product features. The sensitivity of the metrology features to process variations may be different compared to the product features. In that case a so-called "Metrology To Device" offset (further also referenced to as MTD) may be determined. To mimic the behavior of product features the metrology targets may incorporate segmented features, assist features or features with a particular geometry and/or dimension. A carefully designed metrology target should respond in a similar fashion to process variations as the product features. More information on metrology target design can be found in international Patent Application Publication No. WO 2015101458 which is incorporated herein by reference.

The distribution of the locations across the substrate and/or patterning device where the metrology targets are present and/or measured is often referred to as the "sampling scheme". Typically the sampling scheme is selected based on an expected fingerprint of the relevant process parameter (s); areas on the substrate where a process parameter is expected to fluctuate are typically sampled more densely than areas where the process parameter is expected to be constant. Further there is a limit to the number of metrology measurements which may be performed based on the allowable impact of the metrology measurements on the throughput of the lithographic process. A carefully selected sampling scheme is important to accurately control the lithographic process without affecting throughput and/or assigning a too large area on the reticle or substrate to metrology features. Technology related to optimal positioning and/or measuring metrology targets is often referred to as "scheme optimization". More information on scheme optimization can be found in international Patent Application Publication No. WO 2015110191 and the European patent application, application number EP16193903.8 which are incorporated herein by reference.

Figure 3:
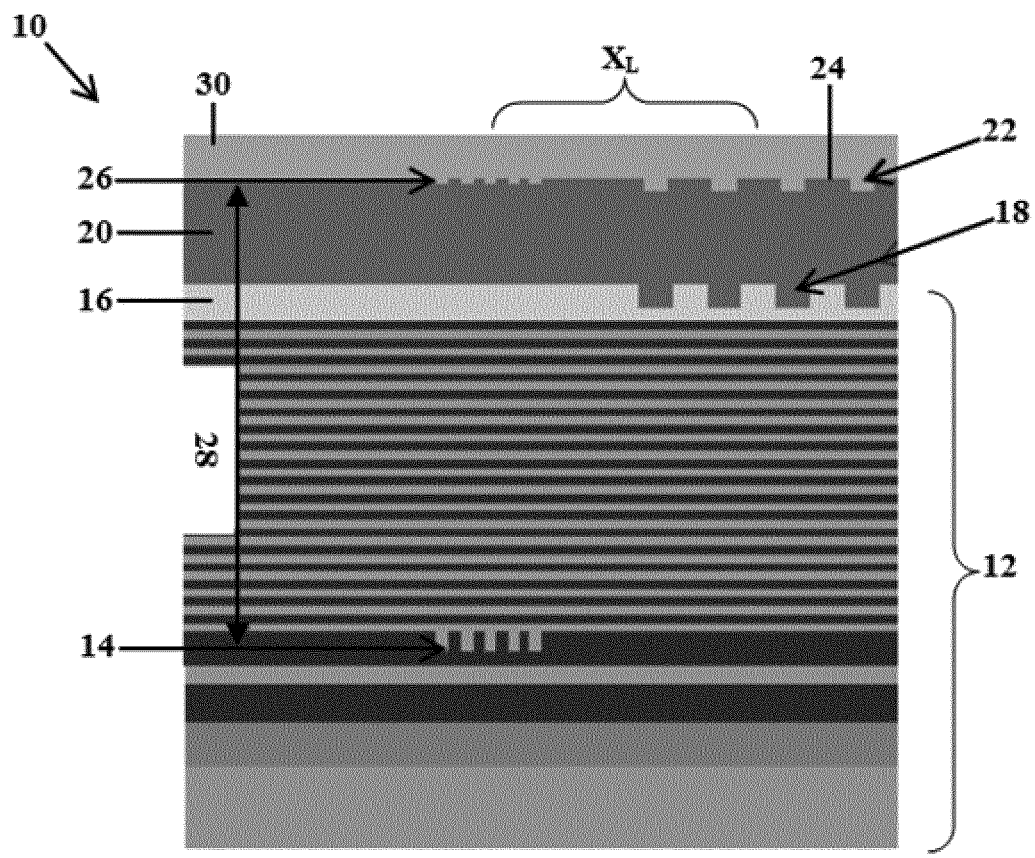
FIG. 3 depicts a schematic view of part of a substrate including alignment marks for assisting with the alignment of layers in the substrate.

FIG. 3 depicts part of a substrate 10 including a number of intermediate layers 12 including a feature, which in this example is in the form of a target alignment mark 14 such as a grating, or the like. The target alignment mark 14 is etched into one of the intermediate layers 12. A number of additional intermediate layers 12 are deposited over the layer 12 including the target alignment mark 14. A further intermediate layer 12, which in this example is in the form of a nitride layer 16, is deposited on the additional intermediate layers 12. A first alignment mark 18 is etched into the nitride layer 16 at a defined lateral distance '$X_L$' from the equivalent position of the target alignment mark 14.

A layer comprising carbon (hereinafter referred to as a "carbon layer" 20), which in this example is in the form of a carbon hard mask, is deposited on the nitride layer 16. Due to the shape of the etched first alignment mark 18 in the nitride layer 16, the deposition of the carbon layer 20 forms a corresponding second alignment mark 22 vertically above the first alignment mark 18 (e.g. on an upper surface 24 of the carbon layer 20). The second alignment mark 22 is substantially laterally aligned with the first alignment mark 18 underlying the carbon layer 20. By using the defined lateral distance '$X_L$' it is possible to determine the lateral position of the target alignment mark 14 underlying the carbon layer 20 and the intermediate layers 12 and etch a further target alignment mark 26 in the upper surface 24 of the carbon layer 20. Since the target alignment mark 14 and the further target alignment mark 26 are approximately laterally aligned, it is possible to indirectly align the layers in the substrate 10 and ensure that any overlay (OV) 28 misalignment is minimized A resist layer 30 can be deposited on the carbon layer 20 when required during the manufacturing process. As the OV 28 budget becomes tighter e.g. for ICs having smaller structures, this indirect alignment process may not provide sufficient accuracy to ensure that structures in the layers are appropriately laterally aligned relative to each other.

Figure 4A:
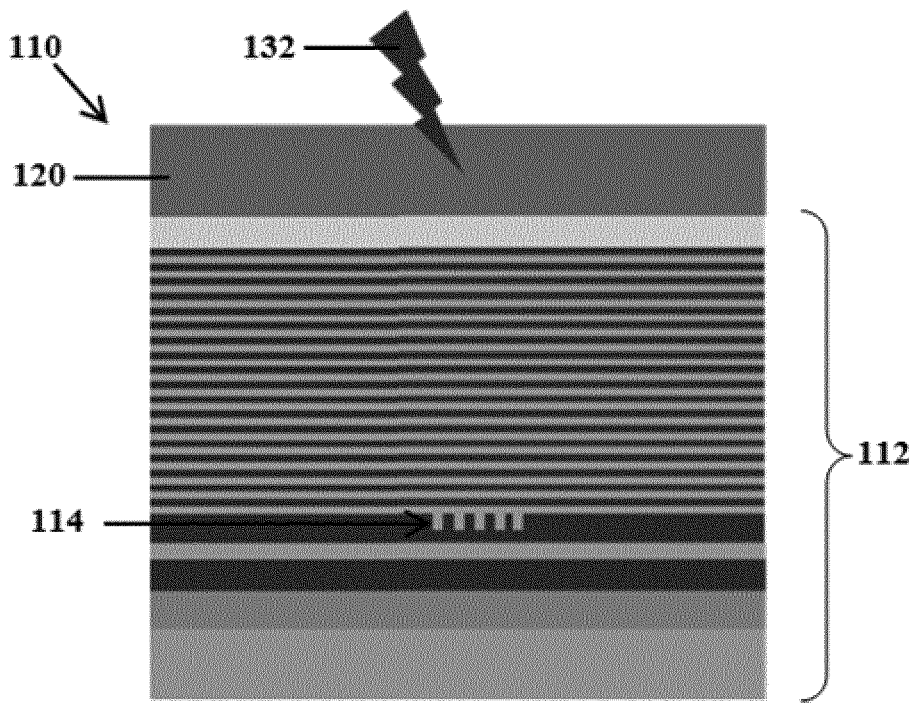
FIGS. 4a-4c depict schematic views of part of a substrate during different steps of a procedure for determining information relating to at least one feature in the substrate according to an example of the present disclosure.
Figure 4B:
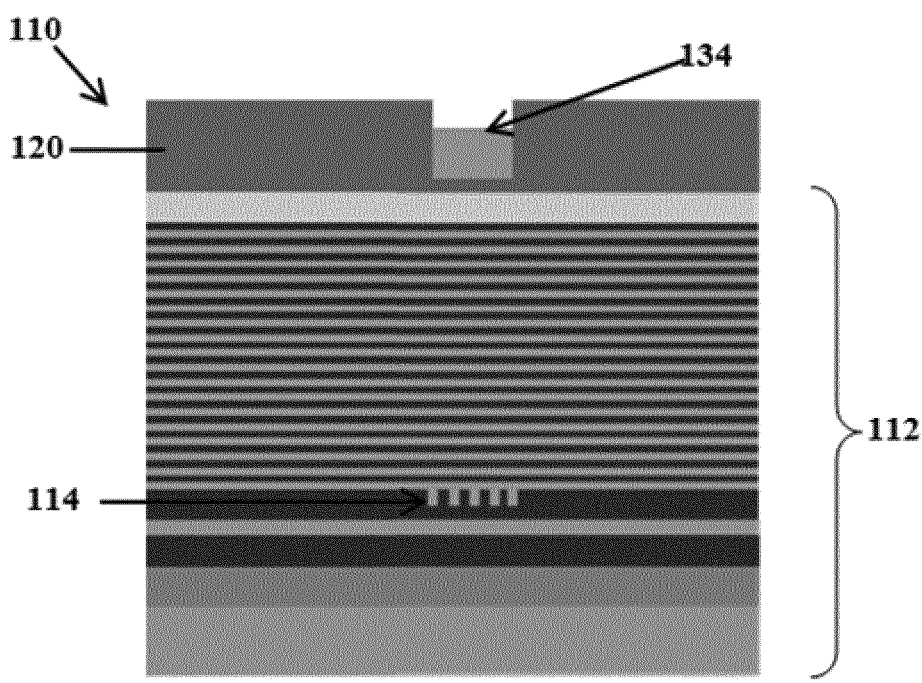
Figure 4C:
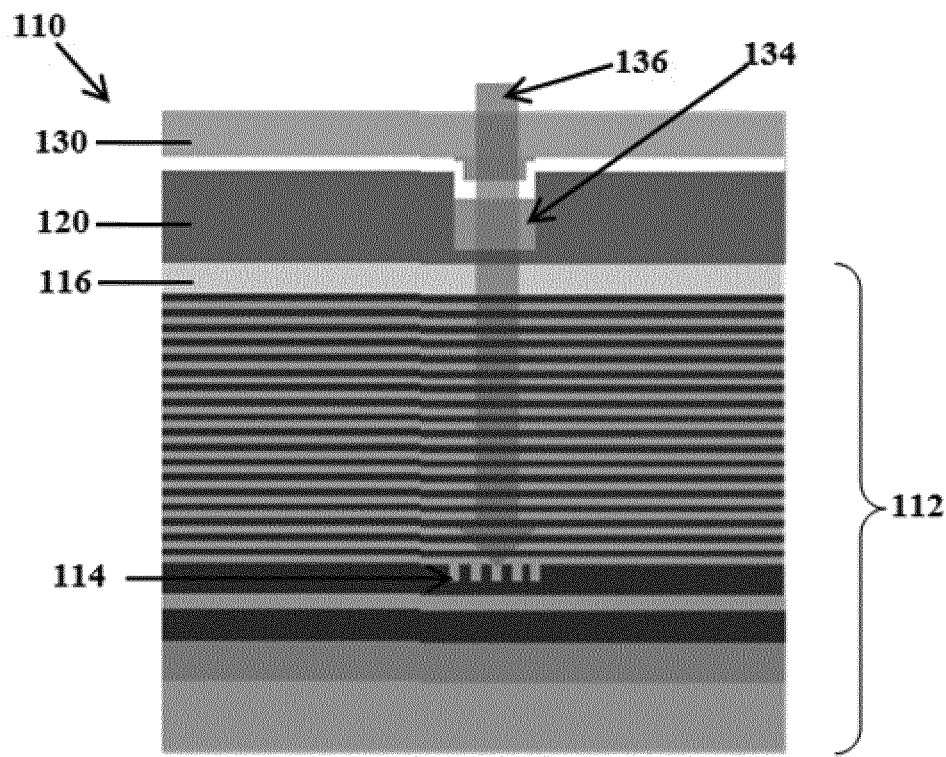

FIGS. 4a-4c depict part of a substrate 110 that is similar to the substrate 10. In contrast to FIG. 3, FIGS. 4a-4c respectively illustrate three steps of a different alignment procedure for determining alignment between the layers in the substrate 110 and/or for determining any other information from the feature. Elements in FIGS. 4a-4c that are like or similar to corresponding elements in FIG. 3 are indicated by reference signs incremented by 100 compared with FIG. 3. The substrate 110 and the process for determining the alignment of layers in the substrate 110 is described in greater detail herein.

In contrast to the procedure in FIG. 3 in which: (i) a first alignment mark 18 is etched into the nitride layer 16; and subsequently (ii) a carbon layer 20 is deposited thereon; and then (iii) a further target alignment mark 26 etched into the carbon layer 20, no such etching steps are used in the procedure for FIGS. 4a-4c. Instead, as illustrated by FIG. 4a, a carbon layer (e.g. in the form of a carbon layer 120) is deposited on a nitride layer 116 such that an upper surface 124 of the carbon layer 120 is planar and does not include any alignment marks therein.

A feature, which in this example is in the form of a target alignment mark 114 etched into one of a number of intermediate layers 112, is at least partially obscured by the carbon layer 120, such that an optical signal (not shown in FIG. 4a) for determining information about, such as the position of, the target alignment mark 114 is prevented from reaching the target alignment mark 114 due to optical absorption in the carbon layer 120.

An energy delivery system (not shown here but described below) is provided to emit a beam (e.g. of radiation and/or particles), which in this example is in the form of a laser beam 132, for modifying at least one portion 134 of the carbon layer 120 to increase its transparency when the laser beam 132 is incident thereon. As illustrated by FIG. 4b, the laser beam 132 has modified the portion 134 resulting in an increase in transparency of the portion 134 compared with the surrounding carbon layer 120. Optionally, a debris removal procedure or etching step may be used to remove debris generated by the laser beam 132 interaction with the portion 134, which may result in the portion 134 having a decreased layer thickness compared with the surrounding carbon layer 120 as shown by FIG. 4b.

As illustrated by FIG. 4c, a resist layer 130 is deposited on the carbon layer 120 including the modified portion 134. An alignment system (not shown) is configured to deliver an optical signal 136 that can propagate through the resist layer 130, through the portion 134, through a nitride layer 116, and through a number of intermediate layers 112 to determine the position of the target alignment mark 114. Due to the increased transparency of the portion 134, the optical signal 136 can at least partly propagate through the portion 134 with less absorption compared with a non-modified area of the carbon layer 120. The optical signal 136 then propagates through the intermediate layers 112 and illuminates the target alignment mark 114. The optical signal 136 may be returned (e.g. reflected, scattered and/or diffracted, or the like) from the target alignment mark 114 such that the returned optical signal (not shown) can propagate back through the portion 134 and the resist layer 130. A substrate alignment system (not shown) includes a radiation sensor (not shown) that is configured to receive optical signal returned through the portion 134. Based on the properties of the received optical signal (e.g. intensity, diffraction and/or interference pattern formed, wavelength(s), and/or the like), the alignment determination system can determine the position and/or orientation of the target alignment mark 114 in order to determine whether the substrate 110 is aligned.

In the procedure illustrated by FIGS. 4a-4c, fewer etching steps are used compared with the procedure illustrated by FIG. 3. By enabling alignment or determining information with fewer etching steps, the time taken to determine alignment/the information may be reduced, and hence the cost of manufacturing may be reduced. Further, additional parts of the etching process may be avoided; e.g. refilling the clear out by transparent, etch stopping material may not be needed. Since the position of the target alignment mark 114 can be determined directly it may be possible to increase the accuracy of the overlay between structures in the layers of the substrate 110.

The process for modifying the portion 134 will now be explained in greater detail. Carbon may take several allotropic forms such as amorphous carbon, graphite, diamond-like carbon (DLC) and diamond. The carbon layer 120 used in the manufacture of ICs is generally in the form of amorphous carbon, which has an extinction coefficient 'k' that can be in excess of 0.4 for UV, visible, and IR wavelengths, although it will be appreciated that amorphous carbon may have a different extinction coefficient 'k' for these and other wavelengths. This relatively high extinction coefficient results in the carbon layer 120 being relatively opaque at these and/or some other wavelengths such that an optical signal for determining the position of the target alignment mark 114 cannot penetrate the carbon layer 120, or at least cannot sufficiently penetrate the carbon layer 120 without optical absorption reducing the signal-to-noise ratio of the optical signal returned from the target alignment mark 114 below a threshold level for accurate determination of the alignment.

In the example of FIG. 4a, the laser beam 132 interacts with the portion 134 to cause a structural modification of the carbon layer 120 resulting in a phase change of the carbon in the layer 120 that can lead to a reduction of the extinction coefficient thereof. The laser beam 132 delivers a laser pulse to modify the structure of the amorphous carbon towards diamond or DLC, which have an extinction coefficient k<0.1 at some wavelengths. This reduced extinction coefficient increases the transparency of the portion 134 to such an extent that the optical signal for determining the position of the target alignment mark 114 can penetrate the carbon layer 120, or at least can sufficiently penetrate the carbon layer 120 without optical absorption reducing the signal-to-noise ratio of the optical signal returned from the target alignment mark 114 below a threshold level for accurate determination of the alignment. The visibility of the target alignment mark 114 through the carbon layer 120 may be increased where the portion 134 has at least partially been modified to form diamond or DLC. By using the laser beam 132 to structurally modify the carbon layer 120 at the portion 134, which is laterally aligned with (e.g. vertically above) the target alignment mark 114, it is possible to make the carbon layer 120 locally more transparent than surrounding areas of the carbon layer 120 to enable alignment directly through the carbon layer 120.

Irradiation by the laser pulses and the associated rapid heating/cooling and/or pressure pulses increases the concentration of sp3 coordinated carbon atoms (which are associated with diamond and DLC) and reduces the concentration of sp2 coordinated carbon atoms (which are associated with amorphous carbon). This structural modification may reduce the concentration and/or mobility of electrons in the valence band of the carbon layer 120, thus reducing the extinction coefficient.

Examples of laser systems for modifying the portion 134 will now be described in greater detail. The peak energy and/or intensity of laser pulses has been associated with generating sufficient heat and/or pressure to cause the conversion of amorphous carbon into carbon and DLC. For example, nanosecond laser pulses at deep ultraviolet (DUV) wavelengths (such as generated by an ArF excimer laser of wavelength 193 nm and pulse duration 20 ns) can be used to melt amorphous carbon and create a highly undercooled state, from which various states of carbon can be created. Such an example is reported in Narayan et al., "Research Update: Direct conversion of amorphous carbon into diamond at ambient pressures and temperatures in air", APL Materials 3, 100702 (2015), which is incorporated herein by reference. Narayan explains that the quenching from the super undercooled state results in nucleation of nanodiamond. Narayan also found that microdiamonds grow out of a highly undercooled state of carbon, with nanodiamond acting as seed crystals.

A further example laser system for structurally modifying carbon in the form of graphite includes an infrared femtosecond (fs) laser system for exposing polycrystalline graphite to 25 fs 558 µJ laser pulses at 4 J/cm$^2$ fluence per pulse in a 4 kHz pulse train. Such an example is reported in Maia et al., "Synthesis of diamond-like phase from graphite by ultrafast laser driven dynamical compression", Scientific Reports 5: 11812 (2015), which is incorporated herein by reference. According to Maia, the example laser system synthesized translucent/transparent micrometer-sized structures carrying diamond-like and/or onion-like carbon phases.

Figure 5:
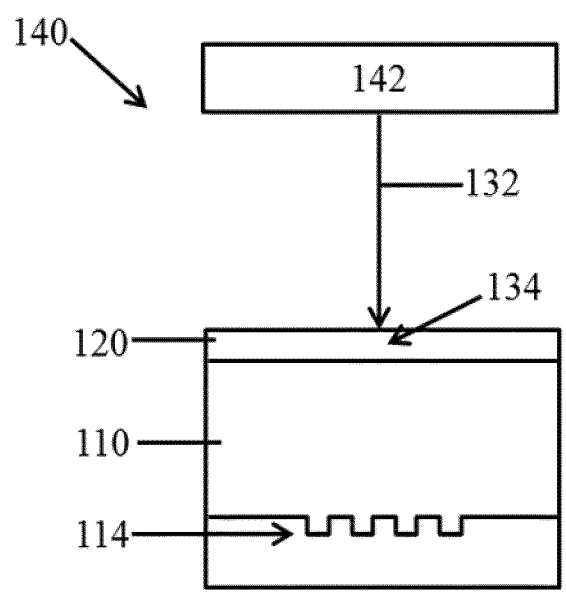
FIG. 5 depicts a schematic overview of an energy delivery system according to an example of the present disclosure.

FIG. 5 illustrates an energy delivery system 140 including an energy source 142 configured to emit radiation and/or particles in a beam, which in this example is in the form of a laser beam 132, for modifying at least one portion 134 of a carbon layer 120 of a substrate 110 to increase the transparency of the portion 134. Modifying the transparency may allow an optical signal to penetrate the modified portion 134 to illuminate a target alignment mark 114 in the substrate 110, as described herein.

Figure 6:
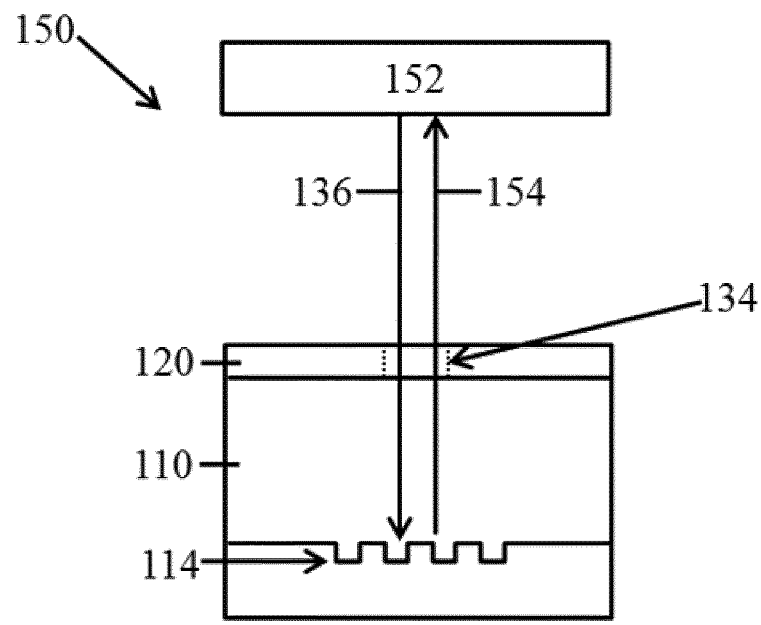
FIG. 6 depicts a schematic overview of a substrate alignment system according to an example of the present disclosure.

FIG. 6 illustrates a substrate alignment system 150, for recovering information such as position, orientation, or the like from the target alignment mark 114. The substrate alignment system 150 includes an optical system 152 for emitting an optical signal 136 for penetrating the modified portion 134 (the boundary of the modified portion in FIG. 6 is indicated by dash lines) of the carbon layer 120 to irradiate the target alignment mark 114 such that a return optical signal 154 can be returned from the target alignment mark 114 to the optical system 152. The return optical signal 154 may encode information such as position, orientation, or the like from the target alignment mark 114 in the form of a reflected, scattered and/or diffracted optical signal. The optical system 152 measures the properties of the return optical signal 154 to determine the information relating to the target alignment mark 114 such as the position and/or orientation of the target alignment mark 114 (and/or any other features or alignment marks) so that an alignment of the substrate 110 can be determined. An example of a substrate alignment system 150 and/or the optical system 152 includes an alignment sensor, for example a SMart Alignment Sensor Hybrid (SMASH) sensor, as referred to in U.S. Pat. No. 8,767,183 B2 and described in relation to U.S. Pat. No. 6,961,116; both of which are incorporated herein by reference. The SMASH sensor includes a self-referencing interferometer with a single detector and four different wavelengths, and extracts the information such as position of the feature using software. It will be appreciated that any appropriate alignment sensor may be used for determining the information. The substrate alignment system 150 and/or the optical system 152 may include a radiation sensor (not shown) for receiving the reflected, scattered and/or diffracted optical signal. The energy delivery system 140, substrate alignment system 150 and/or the optical system 152 may include a Raman detection system (not shown) for measuring a Raman signal produced during modification of the at least one portion 134, or any other appropriate instrument for measuring a property of radiation emitting from the at least one portion 134 before, during or after the modification thereof.

Figure 7:
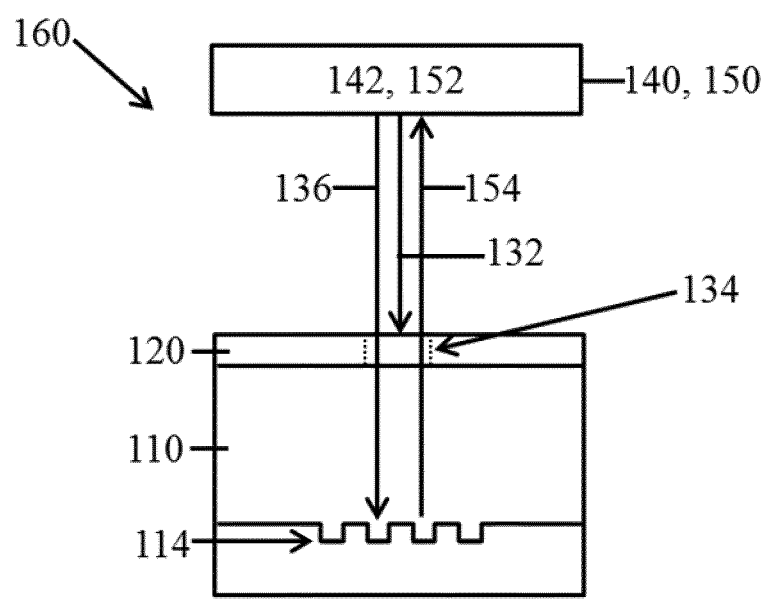
FIG. 7 depicts a schematic overview of an apparatus for determining information relating to at least one feature in a substrate according to an example of the present disclosure.

FIG. 7 illustrates an apparatus 160 for determining information relating to at least one feature such as a target alignment mark 114 in a substrate 110. The apparatus 160 includes parts from FIGS. 5 and 6. In the present example, the target alignment mark 114 in the substrate 110 is at least partially obscured by the carbon layer 120, such that an optical signal 136 provided by the optical system 152 for determining the information relating to the target alignment mark 114 is initially prevented from reaching the target alignment mark 114. The apparatus 160 includes the energy delivery system 140 for modifying at least one portion 134 of the carbon layer 120 to increase its transparency. The energy delivery system 140 includes an energy source 142 for emitting a laser beam 132, such that at least part of the optical signal 136 can propagate through the at least one portion 134 of the carbon layer 120. After modification of the at least one portion 134, the visibility of the target alignment mark 114 is increased such that the optical system 152 can measure a property of a return optical signal 154 from the target alignment mark 114 in order to determine information such as position, orientation, or the like, relating to the target alignment mark 114.

Figure 8:
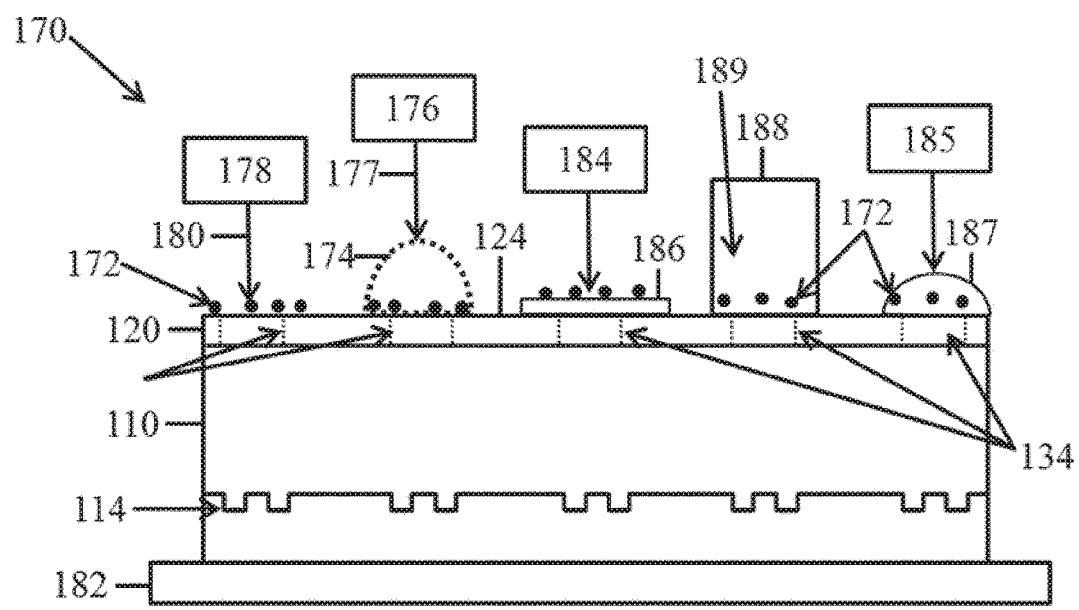
FIG. 8 depicts a schematic overview of a debris removal system for removing debris particles from a surface according to an example of the present disclosure.

FIG. 8 illustrates a debris removal system 170 for removing debris particles 172 from a surface 124 of the carbon layer 120 generated during the modification of the carbon layer 120. The interaction of the laser beam 132 with the carbon layer 120 may result in the formation of an ablation plume 174 above the surface 124, for example, if a parameter (e.g. pulse energy, pulse duration, radiant fluence, or the like) of the laser beam 132 is above an ablation threshold. FIG. 8 is merely schematic and illustrates a number of possible debris removal systems 170 that could be used. For convenience only one substrate 110 is illustrated with a modified portion 134 and corresponding target alignment mark 114 provided for each possible debris removal system 170 but it will be appreciated that one or more of the illustrated debris removal systems 170 may be provided for one substrate 110.

Alternatively or in addition, the debris removal system 170 includes a radiation source 176 such as a laser (not shown) for emitting radiation 177 for irradiating the debris particles 172 formed in an ablation plume 174 during modification of the least one portion 134 of the carbon layer 120 for reducing the debris particle 172 size and/or a number of debris particles 172 in the ablation plume 174. The radiation source 176 may be separate to, part of, or the same as, the energy source 142 described previously.

Alternatively or in addition, the debris removal system 170 includes an electric discharger 178 (e.g. in addition to or separate to the radiation source 176) for generating a plasma 180 above the at least one portion 134 of the carbon layer during modification thereof. The plasma 180 captures charged debris particles 172.

Alternatively or in addition, the debris removal system 170 includes a substrate support 182 onto which the substrate 110 may be placed and/or held. The substrate support 182 is moveable and/or inclinable such that debris particles 172 may move away from the carbon layer 120 under force of gravity and/or by using any appropriate tool for removing the debris particles 172. For example, the substrate support 182 may incline the substrate 110 such that a surface 124 of the carbon layer 120 is facing downwards.

Alternatively or in addition, the debris removal system 170 includes a removable layer deposition system 184, for example a spin coater or the like, configured to apply a removable layer 186 to the surface 124 of the carbon layer 120. Debris particles 172 may be collected on the removable layer 186 so as to be removed using any appropriate method at an appropriate time with removal of the removable layer. Alternatively or additionally, the debris removal system 170 includes a removable layer deposition system 184 in the form of a liquid film applicator 185 configured to apply a liquid film 187 or any other form of liquid to the surface 124 of the carbon layer 120 for collecting or recovering debris particles 172 generated by interaction of the beam 132 with the portion 134. Alternatively or additionally, the debris removal system 170 may include a chamber 188 for holding a liquid or gas for at least partially immersing or surrounding the carbon layer 120.

Alternatively or in addition, the debris removal system 170 includes a reactive medium 189, which may be in the form of a gas and/or liquid which may be held in the chamber 188 so as to react the debris particles 172 generated by modification with the reactive medium 189. The products of the reaction, which may be volatile or soluble, may then be removed, e.g. by movement and/or inclination of the substrate support 182, or any other appropriate method such as by providing a fluid or gas flow through the chamber 188 or over the substrate 110, or the like. The debris particles 172 generated may be handled in any appropriate way to remove the debris particles 172 from the carbon layer 172.

Figure 9:
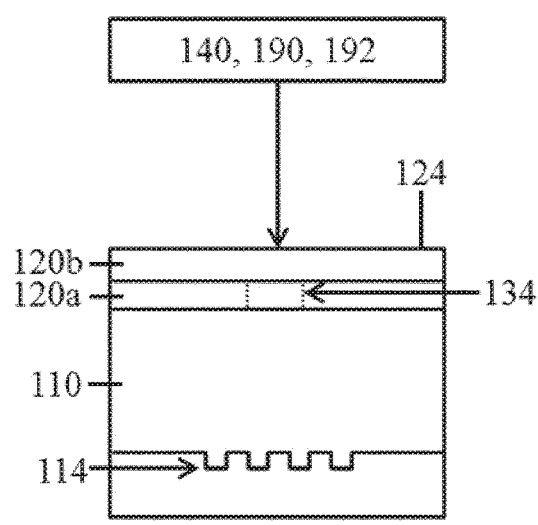
FIG. 9 depicts a schematic overview of a layer deposition system for depositing at least one layer on a substrate according to an example of the present disclosure.

FIG. 9 illustrates a layer deposition system 190 for depositing at least one layer on the substrate 110. The deposition system 190 may include a spin coater or any other appropriate deposition system. The deposition system 190 may form part of a lithographic apparatus or tool (not shown), or any other appropriate instrument. The layer deposition system 190 may be configured to deposit the carbon layer 120 on the substrate 110 one or more of before, during or after the energy delivery system 140 emits the beam 132 for modifying the portion 134. For example, in the illustrated example, the layer deposition system 190 deposits a first carbon sub-layer 120a on the substrate 110, and then the energy delivery system 140 may be used to modify at least one portion 134 of the carbon layer 120, following which, the layer deposition system 190 may be used deposit a second carbon sub-layer 120b on the substrate 110. Thus, the carbon layer 120 may only be partially modified through its overall thickness, as illustrated by FIG. 9. It will be appreciated that any number of carbon layers 120 may be deposited and any of those carbon layers 120 may be modified such that one or more of the carbon layers 120 includes at least one modified portion 134. Each layer of the carbon layers 120 may be regarded as a sub-layer of the overall thickness of the carbon layer 120.

Alternatively or in addition, the deposition system 190 includes or is accompanied by a chemical-mechanical polisher (CMP) 192 for chemical and/or mechanically polishing and/or planarizing the surface 124. The CMP 192 may also be used to remove debris particles 172. The layer deposition system 190 may be used to deposit other layers (e.g. layers having different compositions or materials other than carbon, and/or may be used to deposit dopants such as boron, tungsten, nitrogen and/or any other dopants with the carbon or any other material) on the substrate 110. The layer deposition system 190 may be operable to vary deposition conditions for the creation of at least one seed layer (not shown) in the carbon layer 120 (e.g. on the surface 124 of the carbon layer 124). The seed layer may include sp3-coordinated carbon atoms with concentration above 10%, preferably above 50% for acting as seed layer for nanodiamond nucleation and/or diamond-like carbon, DLC. For example, the layer deposition system 190 may deposit an initial carbon layer 120 on the substrate 110, following which the layer deposition system 190 may deposit a seed carbon layer 120 including sp3-coordinated carbon or the like, on the initial carbon layer 120. The seed carbon layer 120 may be provided by any appropriate method, for example, via a plasma-assisted vapour deposition system or the like.

Figure 10:
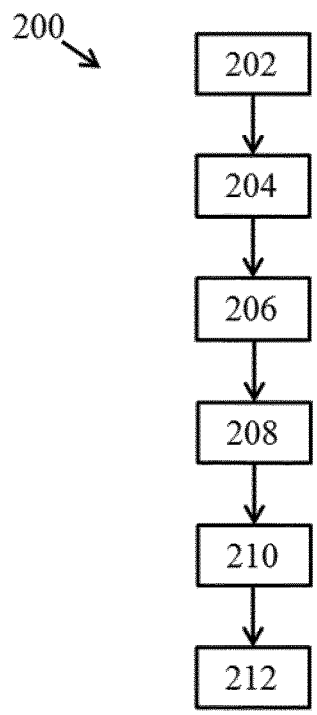
FIG. 10 depicts a schematic overview of parts of a method for determining information relating to at least one feature in a substrate according to an example of the present disclosure.

FIG. 10 illustrates parts of a method 200 for determining information relating to at least one feature such as a target alignment mark 114 in a semiconductor device substrate 110, wherein the target alignment mark 114 is at least partially obscured by a carbon layer 120, such that an optical signal 136 for determining information relating to the target alignment mark 114 is prevented from reaching the target alignment mark 114. The method 200 includes: a first step 202 including emitting, by an energy delivery system 140, radiation and/or particles in a beam 132 for modifying at least one portion 134 of the carbon layer 120 to increase its transparency when the beam 132 is incident thereon. In a second step 204, the radiation and/or particles in the beam 132 are incident on the at least one portion 134 of the carbon layer 120 such that it is modified and at least part of the optical signal 136 for determining the information relating to the target alignment mark 114 can propagate through the at least one portion 134 of the carbon layer 120. In a third step 206, an optical system 152 emits the optical signal 136 for determining the information relating to the target alignment mark 114. In a fourth step 208, the optical signal 136 penetrates the modified at least one portion 134 and at least partially propagates through to irradiate the target alignment mark 114. In a fifth step 210, information relating to the target alignment mark 114 is returned to the optical system 152 through the at least one portion 134 (e.g. the optical signal 136 may be reflected, scattered and/or diffracted by the target alignment mark 114 in the form of a return optical signal 154). In a sixth step 212, the substrate alignment system 150 may use at least one property (e.g. intensity, wavelength(s), interference pattern, and/or the like) of the returned optical signal 152 to determine information (e.g. position, orientation, or the like) relating to the target alignment mark 114.

Figure 11:
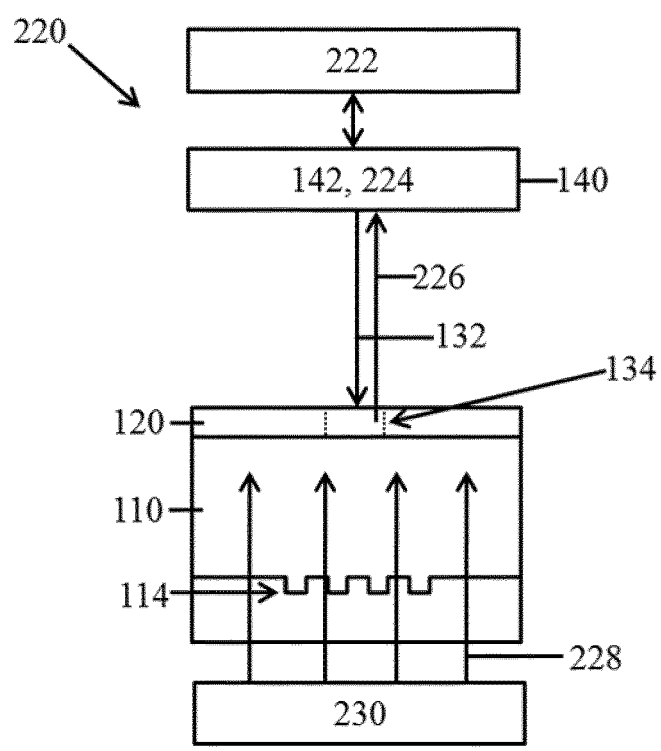
FIG. 11 depicts a schematic overview of a feedback control system.

FIG. 11 illustrates a feedback control system 220 including a control unit 222 configured to determine one or more parameters, such as dimensions, transparency, or the like of the at least one portion 134 of the carbon layer 120 and to control the energy delivery system 140 based on the one or more parameters. Alternatively or in addition, the feedback control system 220 includes a radiation sensor 224, which is configured to receive radiation 226 from the at least one portion 134 of the carbon layer 120 (e.g. which may be emitted during or after modification of the portion 134 by the laser beam 132). The feedback control system 220 is configured to determine the one or more parameters of the at least one portion 134 of the carbon layer 120 based on the received radiation 226. Further, the feedback control system 220 may control, via the control unit 222, the amount of energy being deposited by the energy delivery system 140 (e.g. to control the degree of modification of the portion 134). The received radiation 226 may be derived from the energy source 142 (e.g. reflected, scattered, diffracted or the like from the portion 134), or any other source of radiation and/or particles. Alternatively or in addition, the received radiation 226 includes radiation (and/or particles) 228 produced by a further radiation source such as a backlight 230 that has propagated through the at least one portion 134 of the carbon layer 120 and that has been emitted from a radiation source 226 configured to backlight the substrate 110. The carbon layer 120 may at least partially block the radiation 228 such that upon the portion 134 being modified, the radiation sensor 224 may detect an increase in the level of the radiation 228 (e.g. due to the increase in the transparency thereof) and prompt, via the control unit 222, the energy delivery system 140 to control, reduce or stop the amount of radiation and/or particles being used to modify the portion 134.

The aforementioned examples refer to various apparatus, systems and methods for modifying a carbon layer 120. At least one principle of these apparatus, systems and methods may equally or similarly be applicable for modifying other layers in substrates, for example, used in the manufacture of IC and other semiconductor devices comprising metals, where chemical composition change, propagating into the metal layer may correspond to structural (phase) change propagating into the carbon layer. In the following examples, apparatus, systems and methods are described for modifying a metal layer 320 of a substrate 310.

Figure 12:
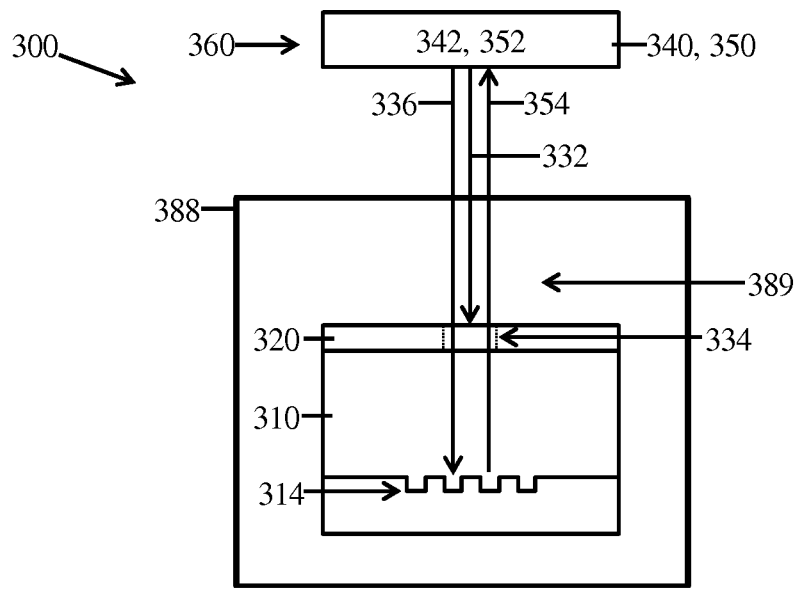
FIG. 12 depicts a schematic overview of a system for modifying a substrate and for determining information relating to at least one feature in the substrate according to an example of the present disclosure.

FIG. 12 illustrates a system 300 for modifying the metal layer 320 of the substrate 310. Like or similar features of the system 300 include reference numerals incremented by 100 or 200, where relevant, compared with the apparatus, systems and methods of the aforementioned examples. The system 300 includes an energy delivery system 340, which in this example, is configured to deliver a laser beam 332 for irradiating at least one portion 334 of the metal layer 320.

Similar to the apparatus 160 in the example of FIG. 7, the system 300 of the example of FIG. 12 includes an apparatus 360 for determining information relating to at least one feature such as a target alignment mark 314 in the substrate 310. Like or similar features of the apparatus 360 that are present in the apparatus 160 of FIG. 7 are associated with reference numerals that are incremented by 200. The apparatus 360 includes parts from FIGS. 5 and 6; FIG. 12 includes corresponding features from FIGS. 5 and 6 with the relevant reference numerals incremented by 200. In the present example, the target alignment mark 314 in the substrate 310 is at least partially obscured by the metal layer 320, such that an optical signal 336 provided by an optical system 352 (e.g. an alignment sensor, or the like) of a substrate alignment system 350 for determining the information relating to the target alignment mark 314 is initially prevented from reaching the target alignment mark 314. The apparatus 360 includes the energy delivery system 340 for modifying at least one portion 334 of the metal layer 320 to increase its transparency. The energy delivery system 340 includes an energy source 342 for emitting the laser beam 332, such that at least part of the optical signal 336 can propagate through the at least one portion 334 of the metal layer 320. After modification of the at least one portion 334, the visibility of the target alignment mark 314 through the at least one portion 334 is increased such that the optical system 352 can measure a property of a return optical signal 354 from the target alignment mark 314 in order to determine information such as position, orientation, or the like, relating to the target alignment mark 314.

The substrate 310 is provided within a chamber 388 configurable to contain a reactive medium 389 such as a liquid or gas (e.g. oxygen, oxygen-rich gas, or the like) configured to permit a reaction (e.g. oxidation, or the like) of the metal layer 320 to occur, or the like. The at least one portion 334 is irradiated in the reactive medium 389 such that the chemical composition of the at least one portion 334 changes (e.g. by becoming oxidized, forming oxygen-based compounds, or the like).

In the example where the reactive medium 389 is configured to cause oxidation of the metal layer 320 (which may be activated or accelerated by the energy delivery system 340), the oxidation process in combination with laser irradiation may involve at least the following processes/considerations. The oxidation process is non-linear and takes place in non-equilibrium circumstances. The (thermo)chemical reaction rate constants have temperature dependencies (Arrhenius-type) and may also depend on other laser parameters (e.g. pulse energy, repetition rate, number of pulses, pulse duration, wavelength, beam intensity distribution, or the like). In the case of short-pulse irradiation, a situation might occur where the temperature variation is faster than the chemical reactions in the medium. In this example, the diffusion length may be less than the oxide layer thickness itself. Further discussion of the laser-induced oxidation process in metals is discussed in Nánaia et al, "Laser-induced oxidation in metals: state of the art", Thin Solid Films 298 (1997) 160-164, the contents of which is incorporated herein by reference.

Figure 13A:
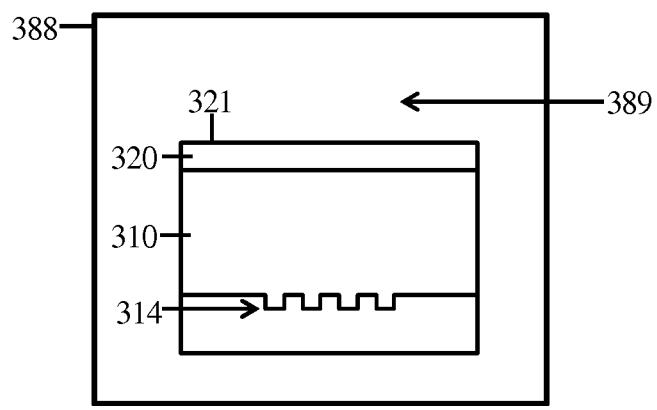
FIGS. 13a-e depict schematic views of steps of an example process for modifying the substrate using the system depicted by FIG. 12.
Figure 13B:
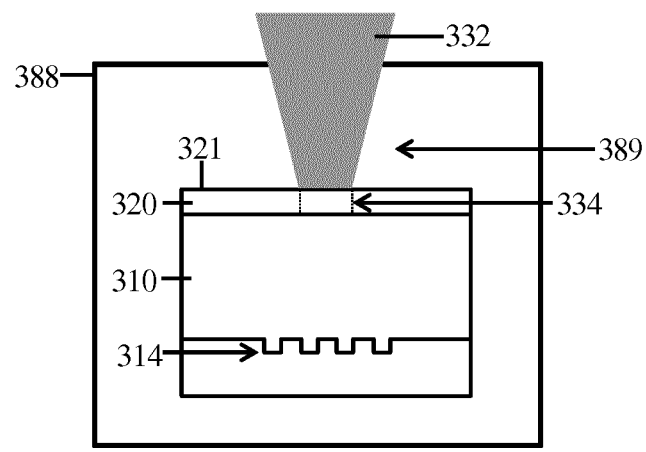
Figure 13C:
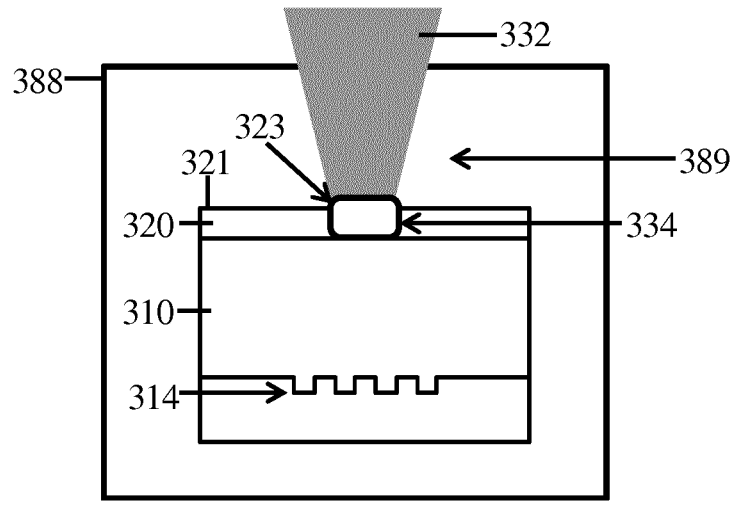

FIGS. 13a-e illustrate steps of an example process using the system 300 for modifying the metal layer 320 of the substrate 310. FIG. 13a depicts the substrate 310 in the chamber 388 before modification by the laser beam 332. Initially, a surface 321 of the metal layer 320 may be passivated, that is, covered with a native oxide layer with a thickness of about 1-50 nm (the thickness of which may be time-dependent and may involve self-limited oxidation). Further and/or faster oxidation may be promoted with diffusion, which may require thermal- or photo-activation of oxygen atoms/molecules. The photo-activation step in which the laser beam 332 irradiated the portion 334 is illustrated by FIG. 13b. In this example, the chamber 388 includes a transparent section for allowing the radiation and/or particles to enter the chamber 300 from an external energy delivery system 340 (not shown in FIG. 13b, but shown in FIG. 12). Additionally or alternatively, the energy delivery system 340 could be provided within the chamber 388. In the step of the process illustrated by FIG. 13c, activated atoms may be adsorbed to the reactive medium 389/substrate 310 interface, which may promote further diffusion of oxygen-containing species into the metal layer 320. FIG. 13c also depicts that the laser-produced oxide (e.g. an oxidized metal such as $WO_3$) forms a protrusion/hill 323 (e.g. due to swelling) that extends out of the surface 321 by ~1.5-3 times (or the like) of the converted metal layer 320 thickness. With the growth of the oxide layer in the reactive medium 389/substrate 310 interface (e.g. surface 321), activated metal atoms may also diffuse into the metal oxide-containing layer 320 (e.g. via vacancies). Accordingly, the process modifies the metal layer 320 by the formation/production of metal oxide in the at least one portion 334 of the metal layer 320. The process may change the optical properties of the metal layer 320 (e.g. at the at least one portion 334). For example, the metal oxide (e.g. as modified by the laser beam 332) has an increased transparency (e.g. in the form of decreased absorption and/or decreased reflectivity) at the operating wavelengths of the substrate alignment system 350. This modification of the at least one portion 334 of the metal layer 320 may allow the substrate alignment system to obtain information (such as relating to position, alignment or the like) from the target alignment mark 314 (or any other features) through the otherwise opaque and/or highly reflective metal layer 320.

The process may convert material of the metal layer 320 fully or partially to material with lower refractive index and extinction coefficient by changing its composition via incorporation of atoms of other elements, e.g. oxygen (oxidation), chloride, nitrogen, bromide, iodide, or the like.

Figure 13D:
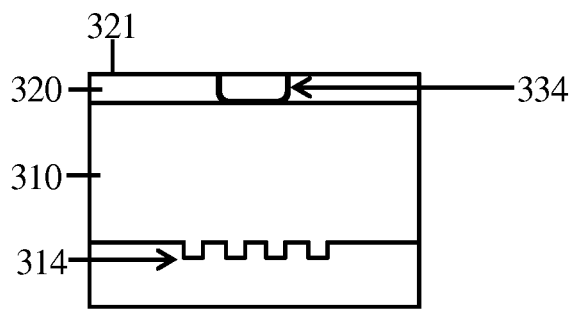
Figure 13E:
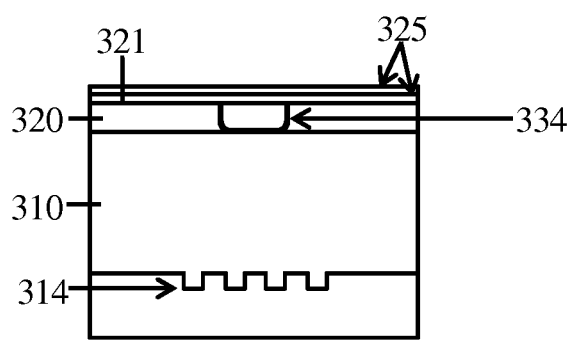

In the example of oxidation, oxygen-containing species are incorporated into the metal layer 320 via a chemically heterogeneous process, based on the diffusion of the species into the substrate. The process of oxygen-containing species incorporation into the metal layer 320 is based on creation of chemical potential and/or the electric fields (e.g. as provided by the laser beam 332), defining the flux and promoting diffusion of the species (oxygen in case of oxidation) which are electrically charged. After the oxidation process, excess material (e.g. additional oxide on the surface 321 of the metal layer 320) is removed, polished and/or cleaned (e.g. by CMP), as depicted by FIG. 13d. FIG. 13e depicts the final state of the substrate 310 with improved visibility of the alignment mark 314 before the substrate 310 is sent to the litho tool. Optionally, BARC and resist layers 325 are deposited on the metal layer 320, including over the modified at least one portion 334. Once the metal layer 320 has been cleaned (and optionally provided with at least one further layer 325 such as depicted in FIG. 13e), the substrate alignment system 350 can be used for determining the information relating to the target alignment mark 314 (and/or any other features). Subsequently, further steps such as additional litho-etch steps and the like can be performed. The process may provide a relatively more straightforward, cheaper, quicker, or the like, procedure for obtaining information from the target alignment mark 314 (and/or any other features). For example, fewer litho-etch steps may be required. In the case where e.g. tungsten (W) layers are used for the metal layer 320, up to 8 (or more) layers may be required. After each deposition of metal (e.g. W), clearout or other steps may need to be repeated. In the case of current X-point devices, clearout or other steps may need to be repeated after deposition of each layer of metal. The process may reduce the need for so many or indeed any clearout steps to be required, which may reduce the time required to manufacture X-point devices or any other devices comprising metal layers.

Although in some examples, the metal layer 320 may include tungsten (W), it will be appreciated that the process may be applicable for the modification of any metals that may exhibit a relatively high opaqueness (e.g. absorption/reflectivly) for the operating wavelength(s) of the substrate alignment system 350.

Laser-based or initiated oxidation (e.g. as caused by the laser beam 332) is different from pure thermal oxidation. As referred to in further detail below, photolytic and/or pyrolytic influence of the laser beam 332 on oxidation and/or other reactive processes may be relevant to the process, for example, impurity or defect injections may accelerate the process of diffusion of specimens (e.g. oxygen-containing species) within the portion 334.

Without wishing to be bound by theory, further details of the process are now described. It will be appreciated that the process may vary depending on any parameters that affect the light-matter interaction between the laser beam 332, the metal layer 320 and the reactive medium 389. The process may involve any of the following steps: Initially, absorption of laser energy according to a linear and/or non-linear mechanism at the metal layer 320 surface 321 occurs, causing the temperature of the surface 321 to be raised. Adhesion and dissociation of oxygen-containing species (e.g. metal oxide molecules, or the like) onto the surface 321 may occur along with nucleation of subatomic layers. Transportation of oxygen-containing species through the oxide layer that forms in the metal layer 320 may occur. These effects may lead to growth of the (metal) oxide interface including the metal layer 320 surface 321.

In a pyrolytic regime for modifying the metal layer 320, a temperature of ~1000-2000° C. is sufficient to activate diffusion of oxygen-containing species from the metal oxide (e.g. at or proximal to the surface 321, or the like) into the bulk metal (e.g. of the metal layer 320). Such a temperature can be achieved once a laser pulse with short duration (e.g. having a pulse width of t<100 ns, or preferably a pulse width in the range 10 fs-10 ns) is incident on the metal layer 320 surface 321 with a fluence in the range 0.01-0.1 J/cm². It will however be appreciated that other pulse duration and fluence combinations may be used and that other parameters such as wavelength, number of pulses, repetition rate, and the like may also affect the process.

For the example of tungsten (W), an oxygen-rich phase (end phase) is tungsten trioxide ($WO_3$), with a volume ratio of W:WO3 of 1:3.3 (or the like). In this process, excess material may be generated so that a build-up above the metal layer 320 surface 321 may create an uneven surface 321. Excess material can be removed as described herein with e.g. CMP, or the like.

As for other metallic material in general, incorporation of other atoms e.g. oxygen-containing species or the like into the metal layer 320 may occur during the process to produce a volume increase (i.e. at different rates for different species and dependent on the type of metal in the metal layer 320).

The process is carried in a sub-ablation regime in which the fluence of the laser beam 332 is below an ablation threshold. Thus, the material removal rate caused by ablation is expected to be smaller than the metal oxide formation rate in the metal layer 320.

A laser pulse from the laser beam 332 may deliver a temperature spike in the metal layer 320, the temperature being raised in a ~10-100 nm thick region of the metal layer 320. The thickness of the raised-temperature layer may be due to a combination of: heat conductivity of the metal layer 320, heat capacity of the metal layer 320, laser beam 332 pulse duration, and laser beam 332 absorption depth within the metal layer 320). It will be appreciated that the spatial temperature distribution within the metal layer 320 may vary as a function of time, and may be dependent on a number of factors in addition to those mentioned above, for example, geometrical considerations (e.g. thickness of the metal layer 320), material properties (e.g. of the metal layer 320 and/or any other layers of the substrate 310), laser beam 334 properties, and the like. Due to dissipation of heat by the metal layer 320, the substrate 310 peak temperature may be significantly (e.g. at least ~10×) lower than that of the metal layer 320, thus the substrate 310 may remain relatively unaffected by the interaction between the laser beam 332 and the metal layer 320. The duration of the hot state caused by the laser beam 332 is dependent on the heat conductivity of the metal layer 320. Further, for a thin film metal layer 320, the head conductivity of the substrate 310 may affect the duration of the hot state. For irradiation of the metal layer 320 in liquids, the duration of the hot state may be affected by heat conductivity and latent heat of evaporation of liquids. In an example, the hot state may last <10 ns. However, it will be appreciated that the duration of the hot state may be dependent on a variety of factors.

The diffusion of oxygen in one pulse from the laser beam 332 may not be sufficient to modify at least a portion of the thickness of the metal layer 320 (e.g. in the range 10-100 nm, or the like). Therefore, multiple-pulse irradiation may be required to achieve sufficient oxide formation within the metal layer 320. In order to achieve the oxide formation within a reasonable time (and to enable high throughput) a laser beam 332 repetition rate of at least 1 kHz, preferably at least 1 MHz, may be used. The duty cycle of laser beam 332 pulses may be <<1% to allow temperature relaxation between pulses (e.g. to avoid heat propagation beyond a spot on the metal layer 320 illuminated by the laser beam 332). It will be appreciated that any appropriate laser parameter (e.g. pulse duration, repetition rate, pulse energy, fluence, duty cycle, or the like) may be varied to control or limit propagation of heat within the metal layer 320 while achieving sufficient oxide formation in the metal layer 320.

In an example, the laser beam 332 may comprise UV radiation for delivering a temperature spike in the metal layer 320. The UV radiation may break chemical bonds within a metal oxide-containing region to an extent that may effectively correspond to a higher temperature than might be possible to achieve using non-UV radiation. The UV radiation may cause light-assisted dissociation of the metal-oxide that releases atoms of oxygen, that can (e.g. in a higher temperature environment) diffuse even more quickly into the metal layer 320 than might otherwise be possible if using a laser beam 332 that does not contain UV radiation.

In an example, the metal layer 320 may be irradiated in a liquid environment. The liquid environment may provide the reactive medium 389 and may additionally prevent oxide evaporation from the metal layer 320. In certain metals, the oxide evaporation temperature may be much lower than the metal evaporation temperature (e.g. $WO_3$ boils at 1700° C., while W boils at 5900° C.). However, metal oxide dissolution in liquid may need to be avoided, for example, by providing a liquid composition and/or pH, for example, that results in the metal oxide formed by the process (e.g. $WO_3$ or the like) being insoluble in the liquid (e.g. water, or the like).

Optionally, a protective layer (for example, a BARC layer, resist layer, or the like that is similar to layer(s) 325) can be deposited prior to laser irradiation with the laser beam 332 to prevent reaction of the metal layer 320 with the agents (e.g. a reactive medium 389 comprising oxygen, or the like) surrounding the irradiated portion 334. The protective layer may be deposited using a layer deposition system or auxiliary layer deposition system (not shown here but may be similar to the aforementioned layer deposition system 190). The laser beam 332 intensity (and/or other laser beam parameters) may be configured to strip the protective layer to allow the metal layer 320 to be modified by the laser beam 332. After the required thickness of the metal layer 320 has been modified, the protecting layer may then be removed (e.g. using CMP, or the like), washed off, or the like.

The aforementioned examples refer to various apparatus, systems and methods for modifying a carbon layer 120 or metal layer 320. The following description refers to apparatus, systems and/or methods for modifying a metal layer 420 of a substrate 410.

Figure 14:
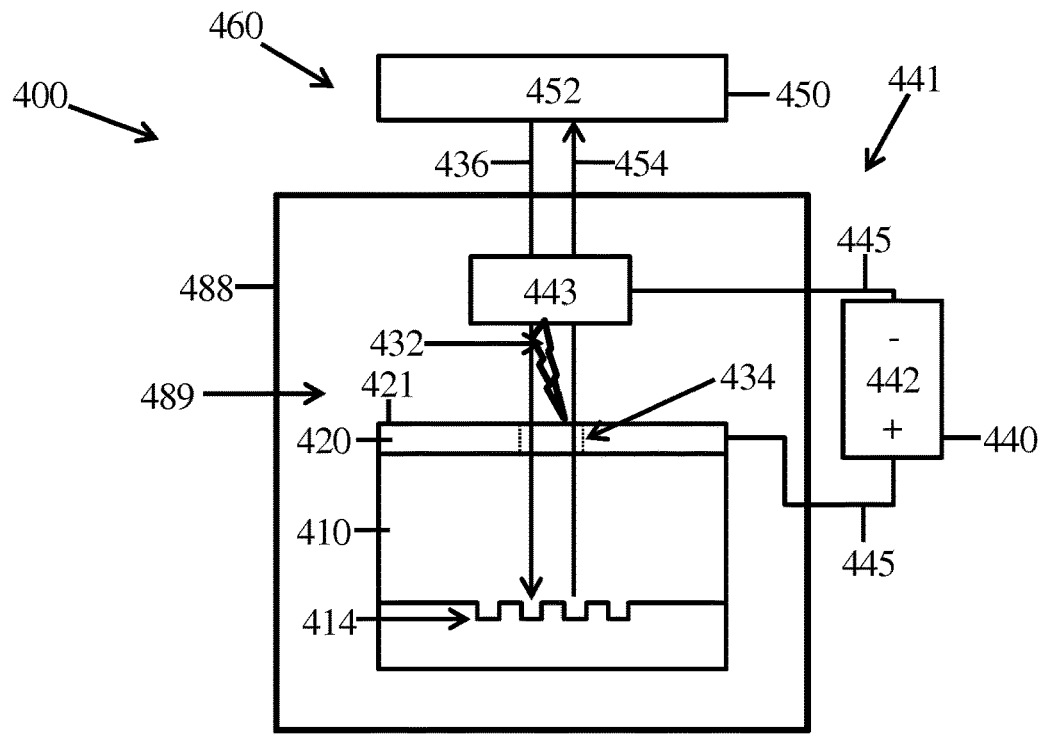
FIG. 14 depicts a schematic overview of a system for modifying a substrate and for determining information relating to at least one feature in the substrate according to an example of the present disclosure.

FIG. 14 illustrates a system 400 for modifying the metal layer 420 of the substrate 410. Like or similar features of the system 400 include reference numerals incremented by 100, where relevant, compared with the system 300 of FIGS. 12, 13*a-e*. The system 400 includes an energy delivery system 440, which in this example, comprises an anodization system 441 for anodizing at least one portion 434 of the metal layer 420.

Similar to the apparatus 160 in the example of FIG. 7 and the apparatus 360 in the example of FIG. 12, the system 400 of the example of FIG. 14 includes an apparatus 460 for determining information relating to at least one feature such as a target alignment mark 414 in the substrate 410. Like or similar features of the apparatus 460 that are present in the apparatus 360 of FIG. 12 are associated with reference numerals that are incremented by 100. In the present example, the target alignment mark 414 in the substrate 410 is at least partially obscured by the metal layer 420, such that an optical signal 436 provided by an optical system 452 (e.g. an alignment sensor, or the like) of a substrate alignment system 450 for determining the information relating to the target alignment mark 414 is initially prevented from reaching the target alignment mark 414. The apparatus 460 includes the energy delivery system 440 for modifying at least one portion 434 of the metal layer 420 to increase its transparency.

The energy delivery system 440 includes an energy source 442 for providing an electric field 432 between the metal layer 420 and an electrode 443 provided (e.g. suspended, supported, or the like) above the metal layer 420. In this example, the energy source 442 takes the form of a voltage source that is electrically connected to the metal layer 420 and the electrode 443 with a polarity such that the metal layer 420 forms an anode and the electrode 443 forms a cathode. Application of the electric field 432 may modify the at least one portion 434 to generate a metal oxide layer at the anode (e.g. the metal layer 420) that is more transparent and/or less reflective than the rest of the metal layer 420. The at least one portion 434 may be modified by the electric field 432 such that at least part of the optical signal 436 can propagate through the at least one portion 434 of the metal layer 420. After modification of the at least one portion 434, the visibility of the target alignment mark 414 is increased such that the optical system 452 can measure a property of a return optical signal 454 from the target alignment mark 414 in order to determine information such as position, orientation, or the like, relating to the target alignment mark 414.

The substrate 410 is provided within a chamber 488 configurable to contain a reactive medium 489 such as a liquid or gas (e.g. oxygen, oxygen-rich gas, or the like) configured to permit a reaction (e.g. oxidation, or the like) of the metal layer 420 to occur, or the like. The at least one portion 434 is anodized in the reactive medium 489 such that the chemical composition of the at least one portion 434 changes (e.g. by becoming oxidized, forming oxygen-based compounds, or the like). In this example, the energy source 442 is positioned externally of the chamber 488 with electrical contacts 445 extending from the energy source 442 into the chamber 488 to electrically connect to the metal layer 420 and the electrode 443 therein.

Figure 15A:
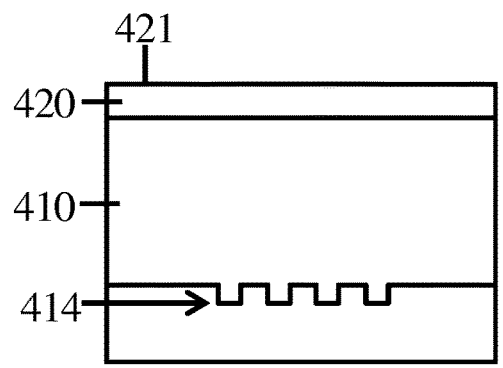
FIGS. 15a-g depict schematic views of steps of an example process for modifying the substrate using the system depicted by FIG. 14.
Figure 15B:
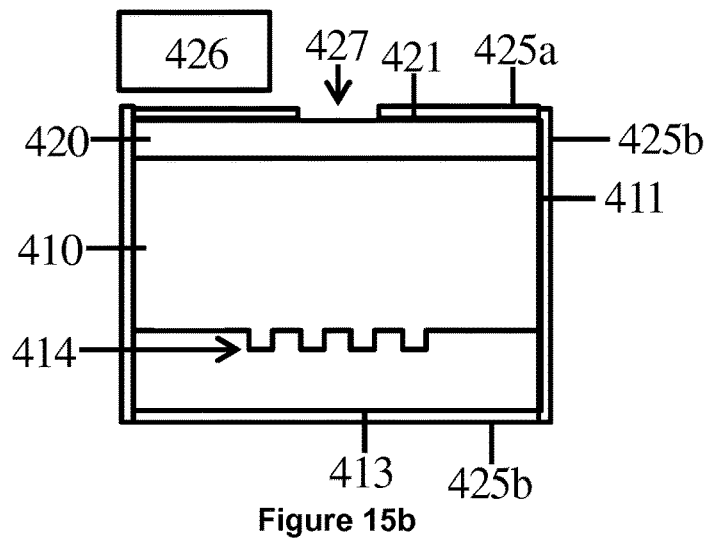

FIGS. 15a-g illustrate steps of an example process using the system 400 for modifying the metal layer 420 of the substrate 410. FIG. 15a depicts the substrate 410 before modification by the anodization system 441. FIG. 15b depicts the substrate 410 with a protective layer 425a of electro-insulating/protective material deposited on the metal layer 420 surface 421 with a clearout 427 of the protective layer 425a above the target alignment mark 414. The clearout 427 is performed by a litho-etch step (a wet etch can be used, which may be a relatively cheap operation) to create a clearout 427 above the target alignment mark 414 in the protective layer 425a. Where more than one target alignment mark 414 is provided, multiple clearouts 427 may be formed using the litho-etch procedure. Optionally, as depicted by FIG. 15b, it may be possible to protect the substrate 410 sides 411 and bottom surface 413 from the anodization system 441 by pre-depositing an insulating layer 425b (which may or may not comprise the insulating material 425a) thereon (e.g. before or during the step depicted by FIG. 15b) using an insulating layer applicator 426. For brevity, layer 425b is not shown in the subsequent figures.

Figure 15C:
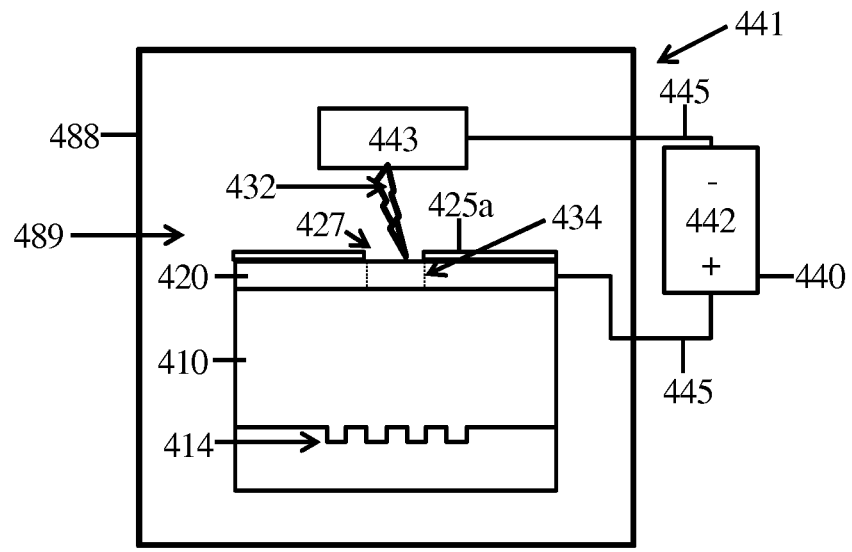
Figure 15D:
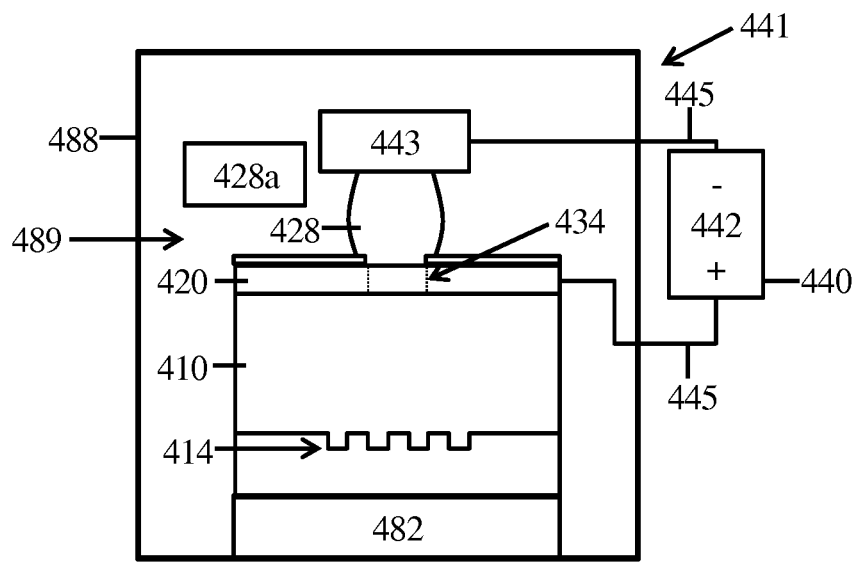

FIG. 15c depicts use of the anodization system 441 depicted by FIG. 14 for performing electrochemical or photoelectrochemical anodization to modify part of the metal layer 420 into oxide within the clearout(s) 427. In an example, the energy source 442 may use bias voltage amplitude, electrolyte composition and/or pH, DC or pulsed bias, DC or pulsed illumination in order to tune a rate of oxidation and porosity of the resulting metal oxide (e.g. $WO_3$ in the case of tungsten). FIG. 15d is similar to FIG. 15c and depicts an electrically conducting liquid 428 provided between the electrode 443 and the at least one portion 434 by a liquid application system 428a. The electrically conducting liquid 428 may comprise the reactive medium 489 for use in anodizing the at least one portion 434. It will be appreciated that the depiction of the conducting liquid 428 in FIG. 15d is schematic. For example, the chamber 488 may be partially or completely filled with the conducting liquid 428. In either case, the insulating layer 425b depicted by FIG. 15b may protect the substrate from the conducting liquid 428. Alternatively or additionally, a substrate support 482 may be provided to hold the substrate 410 such that at least part of the substrate 410 (e.g. the bottom surface 413, or the like) is not in contact with the liquid 428 (which may, for example, otherwise occur if the chamber 488 is completely filled with the conducting liquid 428).

Figure 15E:
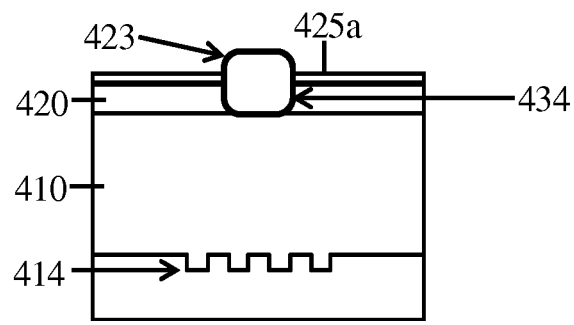

Similar to the example of FIG. 13c and as depicted by FIG. 15e, the anodization-produced oxide (e.g. an oxidized metal such as $WO_3$) forms a protrusion/hill 423 (e.g. due to swelling caused by the oxide having e.g. 2-3× lower density than the rest of the metal layer 420) that extends out of the surface 421 by ~1.5-3 times (or the like) of the modified/converted metal layer 420 thickness.

Optionally or alternatively, clearouts 427 in the insulating layer 425a or a larger/total area of the substrate 410 may be illuminated with e.g. VIS/UV/DUV radiation, or the like, from a radiation source 429 to promote oxide formation in the metal layer 420.

Figure 15F:
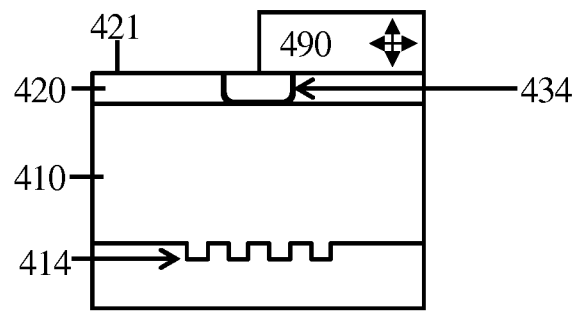

As depicted by FIG. 15f, the insulating layer 425a (and if present, insulating layer 425b) has been removed from the substrate 410. For example, CMP and/or wet etch may be used to clean or planarize the metal layer 420 surface 421, remove the excessive oxide from the protrusion/hill 423, and/or remove the electro-insulating material from the layers 425a, 425b.

FIG. 15f also depicts a layer removal system 490 for removing at least a portion of any layer on the substrate 410 (although the layer removal system 490 may be provided for other steps in the process). For example, the layer removal system 490 may comprise a litho-etch system, and/or a chemical-mechanical polisher (CMP) device (as depicted by FIG. 15f in which the CMP device can be moved in any appropriate direction as depicted by the multi-directional arrows in the box for the layer removal system 490), and/or an ablation system such as a laser. The layer removal system 490 may be configured to clearout a portion of the layer on the substrate 410 to form the clearout 427 (e.g. in FIG. 15b). In this example, the layer removal system 490 may be configured to remove the protective layer 425a and planarize the metal layer 420 such that the protrusion/hill 423 is removed to form a planar surface 421. It will be appreciated that the layer removal system 490 could be configured to at least partially remove at least one of: the protective or electro-insulating layers 425a, 425b, 425c on the substrate 410, BARC and/or resist on the substrate 410, at least part of the metal layer 420, and/or modified metal in the metal layer 420. The layer removal system 490 may be configured for removing material from the substrate other than the layer comprising carbon or metal.

Figure 15G:
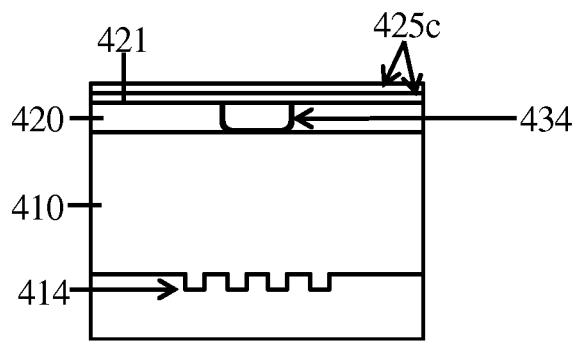

FIG. 15g depicts the final state of the substrate 410 with improved visibility of the alignment mark 414 before the substrate 410 is sent to the litho tool. Optionally, BARC and resist layers 425c are deposited on the metal layer 420, including over the modified at least one portion 434. In an example, a hard mask (e.g. a carbon hard mask, or the like) can be replaced with a thin metal layer (e.g. for 3D X-point devices, or the like.)

Anodization has been used to produce $WO_3$ in several examples. 2.6 μm thick $WO_3$ has been achieved by photo-electrochemical anodization, as reported in Kim et al., "*Photoelectrochemical anodization for the preparation of a thick tungsten oxide film*", Electrochemistry Communications, Vol. 17 pp. 10-13 (2012), the contents of which is incorporated herein by reference, Mesoporous $WO_3$ films with a thickness up to approximately 2 μm have been formed, as reported in Yang et al., "*Thick porous tungsten trioxide films by anodization of tungsten in fluoride containing phosphoric acid electrolyte*", Electrochemistry Communications, Vol. 11. pp. 1908-1911 (2009), the contents of which is incorporated herein by reference. Nanoporous $WO_3$-x with pore diameters between 5 and 600 nm has been fabricated, as reported in Bauersfeld et al., "*Nanoporous Tungsten Trioxide Grown by Electrochemical Anodization of Tungsten for Gas Sensing Applications*", Procedia Engineering, Vol. 47, pp. 204-207 (2012), the contents of which is incorporated herein by reference.

It will be appreciated that an oxide produced via anodizing may be amorphous and nanoporous. In an example, pores may be <1 μm, and preferably <100 nm in order to prevent intense scattering of light (e.g. from the optical signal 436) provided by the optical system 452. The porosity of the metal oxide can be tuned via the composition of the reactive medium 389, current density, pulsing of the bias, and the like, of the energy source 442.

Providing at least one thin (e.g. thickness, h<100 nm, preferably h<30 nm) layer of e.g. tungsten at a base 435 of the at least one portion 434 (i.e. at the interface between the metal layer 420 and an underlying layer of the substrate 410) where oxide is formed may help to ensure that any layers of the substrate 410 below the metal layer 420 may be unaffected by the anodizing process. It will be appreciated that the optical system 452 may, in some examples, still be capable of obtaining sufficient signal 454 through the thin layer(s) to enable the optical system 452 to directly obtain information relating to the target alignment mark 414 and/or other features through the base 435.

Further options and alternatives relating to modifying the metal layer 420 are now described. It will be appreciated that these options and alternatives may be applicable to either or both of the aforementioned systems 300, 400. Further, these options and alternatives may be applicable to any of the examples described herein, for example, any of the apparatus, methods and systems relating to modification of the carbon layer 120, and the like.

In an example, at least one apparatus, method and/or system of the present disclosure may be extended to non-oxide based materials (e.g. in the case of modifying the metal layer 320, 420). The aforementioned examples described the local modification or conversion of a metal layer 320, 420 to (e.g. partial) oxide by local thermo- and/or photo-activation and/or electrochemical activation (anodization) as a means to decrease extinction (and optionally, refraction) coefficients. These methods may also be adapted to locally saturate the metal layer 320, 420 with one or more elements selected from the following list: H, B, C, N, O, Cl, Br, F, I, S, Si, P, or the like, in order to reduce extinction/refraction of the metal layer 320, 420 as required. In this example, the energy delivery system 340 may be configured to additionally or alternatively provide an ion beam to saturate the metal layer 320 with other atoms, ions or molecules (e.g. such as the aforementioned elements) to reduce the extinction coefficient in the metal layer 320 at the at least one portion 334. It will be appreciated that other elements may be used for reducing the extinction coefficient and/or index of refraction of the metal layer 320, 420 so as to increase its transparency.

In an example, one or more of the following elements: H, B, C, N (or the like) may be used since their ashing/etching products (that is, if the material of the hard mask needs to be removed later during the manufacturing process) may be considered to be chemically and/or environmentally safe.

There may be a number of considerations when selecting which element(s) can be used for the anodization process, providing the preservation of some of the material in the at least one portion 334, 434 is required, for example:

the boiling point of resulting compositions from the combination of the metal layer 320, 420 and the element(s) may need to be relatively high, e.g. >500° C., otherwise the metal and/or metal oxide may be etched/evaporated away due to the heat in the at least one portion 334, 434, rather than the desired change in composition being propagated into the metal layer 320, 420;

the solubility of resulting compositions may be low (for example, if irradiation in a reactive medium 389, 489 in a liquid form is performed), otherwise the metal layer 320, 420 (which may comprise the metal and/or the metal oxide) may be washed away in the at least one portion 334, 434, rather than the desired change in composition being propagated into the metal layer 320, 420; and/or the band-gap of the resulting composition may be >1 eV, 0.5 eV, or the like, so that the optical signal 336, 435 used in some example optical systems 352, 452 (e.g. which may use wavelengths in the range 0.5-1 μm, 1-2 μm, respectively, or the like) is not (e.g. substantially) absorbed or reflected in the at least one portion 334, 434.

The elements in the abovementioned examples are the smallest according to their atomic radii, thus it is anticipated that these elements may have the highest diffusion coefficients within the metal layer 320, 420 (i.e. compared to elements having larger atomic radii). Alternatively or additionally, it will be appreciated that a high diffusion coefficient of the metal (e.g. tungsten, or the like) itself within the metal layer 320, 420 may be required. For example, a high diffusion coefficient for the metal within the metal-bromide, metal-carbide, metal-nitride, or other compositions may be provided so as to provide high throughput modification or conversion of the metal layer 320, 420.

In an example, an energy source 342 in the form of an particle beam (e.g. electron, proton, ion, or the like) can be used in addition or as an alternative to the laser beam 332 for modifying the at least one portion 334. In an example, an ion energy of ~1-100 keV may penetrate sufficiently deeply into the metal layer 320 (e.g. at least sufficient for processing of metal layers in 3D X-Point devices). In an example, the energy source 342 for producing the ion beam may have a sputtering yield of ~0.1-1/incident ion (e.g. where the target material atoms—e.g. of the metal layer 320—may have a higher mass than the incident ions). In such an example, the growth of the modified or converted at least one portion 334 may proceed at a faster rate than the sputtering, thereby resulting in some of the modified material in the metal layer 320 residing in the at least one portion 334 (rather than be removed entirely by sputtering).

It will be appreciated that at least one feature described in relation to the system 300, as well as related apparatus and methods, may be applicable to, replace, or be combined with at least one feature described in relation to the system 400, as well as related apparatus and methods (and vice versa). It will further be appreciated at least one feature described in relation to the systems 300, 400, as well as related apparatus and methods, may be applicable to, replace, or be combined with at least one feature described in relation to any other example of the present disclosure, for example, any other system, apparatus and method described with reference to FIGS. 1-11 (and vice versa).

It will be appreciated that any appropriate energy delivery system 140 for providing at least one laser beam 132 could be used for modifying the at least one portion 134. For example, the energy source 142 could include at least one: laser; pulsed laser for emitting at least one or a series of laser pulses; a continuous wave (CW) laser, and/or the like. Alternatively or additionally, the energy source 142 could be configured to emit a beam comprising particles for pulsed heating of the at least one portion 134. For example, the energy delivery system 140 could be configured to emit one or more of: an electron beam; an ion beam; a neutral beam; an extreme ultraviolet (EUV) beam in a range from 4 to 20 nm; and a beam comprising radiation having wavelengths in a range from 20 to 100 nm. It will be appreciated that the energy delivery system 140 may be configured to emit one or both of: radiation; and particles for modifying the at least one portion 134.

The apparatus may comprise an electrical connection connected to the layer and configured to provide a voltage/current or ground connection so as to prevent charging of the layer. FIG. 14 illustrates an energy source 442 that takes the form of a voltage source that is electrically connected to the metal layer 420. It will be appreciated that the electrical connection and/or energy source 442 illustrated by FIG. 14 may be used, modified or adapted for use in any of the examples described herein to prevent charging of the layer comprising carbon or metal.

FIGS. 5 and 6 illustrate the energy delivery system 140 and substrate alignment system 150 as separate tools. FIG. 7 illustrate the apparatus 160 which includes features from both the energy delivery system 140 and the substrate alignment system 150. It will be appreciated that the energy delivery system 140 can be used to modify the carbon layer 120 in a first step, and the substrate alignment system 150 can be used to determine information in relation to the target alignment mark 114 in a second step. The first and second steps may be performed within the same or separate tools. For example, the substrate 110 may be moved between different tools between the steps. Alternatively, the substrate 110 may remain in situ during the procedure for determining information in relation to the target alignment mark 114. The apparatus 160 may include one or more tools, which may be separate or integral with each other.

Although the examples described herein refer to the modification of a carbon layer 120, it will be appreciated that other layers may be modified. For example, the energy deposition system 140 may be operable to modify a portion 134 of any layer including an appropriate element, compound or composition. The layer may include pure carbon or doped carbon. For example, the layer may include dopants such as tungsten, boron, nitrogen and/or the like. It will be appreciated that any appropriate dopant or impurity may be deposited along with the carbon. While the present disclosure refers to the layer comprising carbon, it will be appreciated that the modification of a layer not comprising carbon may be contemplated by the present disclosure. The layer may function to provide a hard mask and any appropriate material may be used to provide this functionality. The method and apparatus described to promote a local phase change of the carbon, or carbon comprising layer or its portion may also be applicable to the local change of metal, or metal comprising layer or its portion, provided with supply of reagents and optional cooling.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

In an example, the present disclosure may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

Although specific reference may be made in this text to examples of the present disclosure in the context of a lithographic apparatus, examples of the present disclosure may be used in other apparatus. Examples of the present disclosure may form part of a mask inspection apparatus, a metrology apparatus, a lithography scanner, a lithography tracking system, a substrate or wafer track tool, a deposition tool, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of examples of the present disclosure in the context of optical lithography, it will be appreciated that the present disclosure, where the context allows, is not limited to optical lithography and may be used in other applications, for example imprint lithography.

A computer program may be configured to provide any of the above described methods. The computer program may be provided on a computer readable medium. The computer program may be a computer program product. The product may comprise a non-transitory computer usable storage medium. The computer program product may have computer-readable program code embodied in the medium configured to perform the method. The computer program product may be configured to cause at least one processor to perform some or all of the method.

Various methods and apparatus are described herein with reference to block diagrams or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

Further embodiments of the inventions are disclosed in the list of numbered embodiments below:

1. An apparatus for determining information relating to at least one feature in a semiconductor device substrate, wherein the at least one feature is at least partially obscured by a layer comprising carbon, such that an optical signal for determining the information relating to the at least one feature is prevented from reaching the feature, wherein the apparatus comprises:

an energy delivery system configured to emit radiation and/or particles for modifying at least one portion of the layer to increase its transparency when or after the radiation and/or particles are incident thereon, such that at least part of the optical signal can propagate through the at least one portion of the layer for determining the information relating to the at least one feature.

2. The apparatus of embodiment 1, wherein the energy delivery system is configured to emit a beam for modifying the at least one portion of the layer by reducing the extinction coefficient of the carbon at the at least one portion of the layer.

3. The apparatus of embodiment 1 or 2, wherein the energy delivery system is configured to emit a beam for modifying the at least one portion of the layer by causing a phase change in the carbon and/or causing an increase in the concentration of (e.g. tetravalent/sp3 coordinated) carbon atoms at the at least one portion of the layer.

4. The apparatus of embodiment 3, wherein the phase change modifies the carbon at the at least one portion of the layer such that the carbon forms at least one of: diamond; and diamond-like carbon.

5. The apparatus of any preceding embodiment, wherein the energy delivery system comprises at least one of: at least one laser for emitting the radiation and/or at least one source of a focused beam of energetic particles.

6. The apparatus of embodiment 5, wherein the at least one laser comprises a pulsed laser source configured to emit at a series of laser pulses.

7. The apparatus of embodiment 5 or 6, wherein the at least one laser is configured to emit radiation having at least one wavelength in a range from 4 nm to 3 μm.

8. The apparatus of any of embodiments 5 to 7, wherein the at least one laser is configured to emit one or more of:

visible and/or infrared laser pulses with a pulse duration in a range from 5 fs to 500 ps;

ultraviolet laser pulses with a pulse duration in the range 1 ps to 500 ns; and soft X-ray to DUV laser pulses with a pulse duration in the range 1 fs to 100 ns.

9. The apparatus of any of embodiments 5 to 8, wherein the at least one laser is configured to emit an initial pulse train comprising at least one laser pulse of a first pulse duration, and further configured to emit a subsequent pulse train comprising at least one laser pulse of a shorter, second pulse duration.

10. The apparatus of any of embodiments 5 to 9, wherein the at least one laser is configured to emit radiation having a peak radiant fluence or intensity of radiation below an ablation threshold for the layer.

11. The apparatus of any of embodiments 5 to 10, wherein the at least one laser is configured to emit at least one of: a linear polarized radiation; non-linear polarized radiation; elliptical polarized radiation; and spiral polarized radiation.

12. The apparatus of embodiment 11, wherein the at least one laser is configured to emit a sequence of laser pulses, each laser pulse having one of: linear polarization; circular polarization; elliptical polarization; and spiral polarization; and/or a sequence of laser pulses with some pulses within the train having a different polarization to other pulses within the train.

13. The apparatus of any preceding embodiment, wherein the energy delivery system is configured to emit radiation and/or particles for pulsed heating of the at least one portion of the layer.

14. The apparatus of embodiment 13, wherein the energy delivery system is configured to emit one or more of: an electron beam; an ion beam; a neutral beam; an extreme ultraviolet (EUV) beam in a range from 5 to 20 nm; and a beam comprising radiation having wavelengths in a range from 20 to 100 nm.

15. The apparatus of any preceding embodiment, further comprising a feedback control system configured to determine one or more parameters of the at least one portion of the layer and to control the energy delivery system based on the one or more parameters.

16. The apparatus of embodiment 15, wherein the feedback control system comprises a radiation sensor configured to receive radiation from the at least one portion of the layer, and wherein the feedback control system is configured to determine the one or more parameters of the at least one portion of the layer based on the received radiation.

17. The apparatus of embodiment 16, wherein the received radiation comprises one or more of:

the radiation from the energy delivery system reflected or scattered from the at least one portion of the layer;

radiation that has propagated through the at least one portion of the layer and that has been emitted from a radiation source configured to backlight the semiconductor device substrate;

radiation excited in the portion of the layer by radiation and/or particles from the energy delivery system; and radiation from an auxiliary light source, directed to and reflected and/or scattered from a spot that overlaps substantially with the portion of the layer that is modified by the energy delivery system.

18. The apparatus of any preceding embodiment, wherein the energy delivery system is configured to emit radiation and/or particles for modifying the transparency of the at least one portion of the layer to a depth less than the overall thickness of the layer.

19. The apparatus of any preceding embodiment, comprising a layer deposition system for depositing the layer on the substrate.

20. The apparatus of embodiment 19, wherein the layer deposition system is configured to deposit a first sub-layer of the layer on the substrate, and wherein the energy delivery system is operable to modify at least one portion in the first sub-layer.

21. The apparatus of embodiment 20, wherein the layer deposition system is configured to deposit a second sub-layer of the layer on the first sub-layer after modification of the at least one portion of the first sub-layer.

22. The apparatus of any of embodiments 19 to 21, wherein the layer deposition system is operable to vary deposition conditions for the creation of at least one seed sub-layer in the layer, the seed sub-layer comprising sp3-coordinated carbon for acting as seed for nanodiamond nucleation and/or diamond-like carbon, DLC.

23. The apparatus of embodiment 22, wherein the layer deposition system is configured to deposit the at least one seed sub-layer at an upper surface of the layer.

24. The apparatus of any preceding embodiment, comprising a debris removal system for removing from a surface of the layer debris particles generated during the modification.

25. The apparatus of embodiment 24, wherein the debris removal system comprises a radiation source for emitting radiation for irradiating the debris particles formed in an ablation plume during modification of the least one portion of the layer for reducing the debris particle size and/or a number of debris particles in the ablation plume.

26. The apparatus of embodiment 24 or 25 wherein the debris removal system comprises an electric discharger for generating a plasma above the at least one portion of the layer during modification thereof, the plasma capturing charged debris particles.

27. The apparatus of any of embodiments 24 to 26, wherein the debris removal system is configured to incline the semiconductor device substrate, such that the debris particles move away from the layer under force of gravity.

28. The apparatus of any of embodiments 24 to 27, wherein the debris removal system is configured to apply a removable layer to a surface of the layer, wherein the debris particles are collected on the removable layer, the debris removal system being further configured to remove the removable layer after modification of the at least one portion of the layer.

29. The apparatus of embodiment 28, wherein the debris removal system is configured to remove the removable layer at the location of the at least one portion of the layer before the energy delivery system emits the radiation and/or particles.

30. The apparatus of any of embodiments 24 to 29, wherein the debris removal system is configured to provide a reactive medium in proximity to the at least one portion of the layer, such that only the products of reaction of material within the ablation plume are substantially volatile or soluble.

31. The apparatus of any preceding embodiment, further comprising a chamber configured to hold a liquid, and wherein the semiconductor device substrate is at least partially immersed in the liquid at least during emission of the radiation and/or particles by the energy delivery system.

32. The apparatus of any preceding embodiment, further comprising a liquid film applicator configured to apply a liquid film to a surface of the layer before the energy delivery system emits the radiation and/or particles.

33. The apparatus of any preceding embodiment, comprising an optical system configured to transmit an optical signal through the at least one portion of the layer for determining information relating to the at least one feature.

34. The apparatus of any preceding embodiment, comprising a substrate alignment system for determining information relating to the at least one feature based on a return optical signal received through the at least one portion of the layer.

35. The apparatus of embodiment 34, wherein the substrate alignment system is configured to determine at least one of: the presence; position and orientation of the at least one feature in order to determine whether the substrate is aligned.

36. The apparatus of embodiment 35, wherein the substrate alignment system is configured to control the relative positioning between the substrate and a lithography apparatus or lithographic tool to align the substrate therein.

37. The apparatus of any preceding embodiment, wherein the feature comprises an alignment or overlay mark.

38. The apparatus of any preceding embodiment, wherein the modified layer comprises at least 20% carbon, and optionally comprises at least 50% carbon.

39. A lithography apparatus comprising the apparatus of any one of embodiments 1 to 38.

40. A lithographic tool comprising the apparatus of any one of embodiments 1 to 38.

41. A method for determining information relating to at least one feature in a semiconductor device substrate, wherein the at least one feature is at least partially obscured by a layer comprising carbon, such that an optical signal for determining information relating to the at least one feature is prevented from reaching the feature, wherein the method comprises:

emitting, by an energy delivery system, radiation and/or particles for modifying at least one portion of the layer to increase its transparency when or after the radiation and/or particles is incident thereon, such that at least part of the optical signal for determining the information relating to the at least one feature can propagate through the at least one portion of the layer for determining the information relating to the at least one feature.

42. A computer program comprising instructions which, when executed on at least one processor, cause the at least one processor to control an apparatus to carry out the method according to embodiment 41.

43. A carrier containing the computer program of embodiment 42, wherein the carrier is one of an electronic signal, optical signal, radio signal, or non-transitory computer readable storage medium.

44. An apparatus for determining information relating to at least one feature in a semiconductor device substrate, wherein the at least one feature is at least partially obscured by a layer comprising carbon or metal, such that an optical signal for determining the information relating to the at least one feature is prevented from reaching the feature, wherein the apparatus comprises:

an energy delivery system configured for modifying at least one portion of the layer to increase its transparency, such that at least part of the optical signal can propagate through the at least one portion of the layer for determining the information relating to the at least one feature.

45. The apparatus of embodiment 44, wherein the energy delivery system is configured to emit a beam for modifying the at least one portion of the layer by reducing the extinction and/or refraction coefficient of the carbon or metal at the at least one portion of the layer.

46. The apparatus of embodiment 44 or 45, wherein the energy delivery system is configured to emit a beam for modifying the at least one portion of the layer comprising carbon by causing a phase change in the carbon and/or causing an increase in the concentration of tetravalent (sp3 coordinated) carbon atoms at the at least one portion of the layer.

47. The apparatus of embodiment 46, wherein the phase change modifies the carbon at the at least one portion of the layer such that the carbon forms at least one of: diamond; and diamond-like carbon.

48. The apparatus of any preceding embodiment, wherein the energy delivery system comprises at least one of: at least one laser for emitting radiation and/or at least one source of a focused beam of energetic particles.

49. The apparatus of embodiment 48, wherein the at least one laser comprises a pulsed laser source configured to emit at a series of laser pulses.

50. The apparatus of embodiment 48 or 49, wherein the at least one laser is configured to emit radiation having at least one wavelength in a range from 4 nm to 3 µm.

51. The apparatus of any of embodiments 48 to 50, wherein the at least one laser is configured to emit one or more of: visible and/or infrared laser pulses with a pulse duration in a range from 5 fs to 500 ps; ultraviolet laser pulses with a pulse duration in the range 1 ps to 500 ns; and soft X-ray to DUV laser pulses with a pulse duration in the range 1 fs to 100 ns.

52. The apparatus of any of embodiments 48 to 51, wherein the at least one laser is configured to emit an initial pulse train comprising at least one laser pulse of a first pulse duration, and further configured to emit a subsequent pulse train comprising at least one laser pulse of a shorter, second pulse duration.

53. The apparatus of any of embodiments 48 to 52, wherein the at least one laser is configured to emit radiation having a peak radiant fluence or intensity of radiation below an ablation threshold for the layer.

54. The apparatus of any of embodiments 48 to 53, wherein the at least one laser is configured to emit at least one of: a linear polarized radiation; non-linear polarized radiation; elliptical polarized radiation; and spiral polarized radiation.

55. The apparatus of embodiment 54, wherein the at least one laser is configured to emit a sequence of laser pulses, each laser pulse having one of: linear polarization; circular polarization; elliptical polarization; and spiral polarization; and/or a sequence of laser pulses with some pulses within the train having a different polarization to other pulses within the train.

56. The apparatus of any preceding embodiment, wherein the energy delivery system is configured to emit radiation and/or particles for pulsed heating of the at least one portion of the layer.

57. The apparatus of embodiment 56, wherein the energy delivery system is configured to emit one or more of: an electron beam; an ion beam; a neutral beam; an extreme ultraviolet (EUV) beam in a range from 5 to 20 nm; and a beam comprising radiation having wavelengths in a range from 20 to 100 nm.

58. The apparatus of any preceding embodiment, wherein the energy delivery system is configured to emit radiation and/or particles to modify the at least one portion of the layer comprising metal.

59. The apparatus of embodiment 58, wherein the energy delivery system is configured to modify the at least one portion of the layer comprising metal in the presence of a reactive medium so as to chemically convert the at least one portion of the layer to change the chemical composition of the at least one portion.

60. The apparatus of embodiment 58 or 59, wherein the energy delivery system comprises a laser configured to emit pulses with a duration of less than 100 ns, and optionally less than 10 ns, and optionally more than 10 fs.

61. The apparatus of embodiment 60, wherein the laser is configured to deliver multiple pulses, and optionally wherein the pulse repetition rate is at least 1 kHz, and optionally wherein the pulse repetition rate is at least 1 MHz, and/or optionally wherein the duty cycle of the pulses is less than 1%.

62. The apparatus of embodiment 60 or 61, wherein the laser is configured to emit radiation with a fluence in the range 0.01-1 J/cm$^2$.

63. The apparatus of any one of embodiments 58 to 62, wherein the energy delivery system is configured to provide an ion beam to saturate the layer comprising metal with other atoms, ions or molecules to increase the transparency in the at least one portion of the layer comprising metal.

64. The apparatus of embodiment 63, wherein the ion beam energy is greater than 1 eV, and optionally greater than 100 eV.

65. The apparatus of embodiment 63 or 64, wherein the ions comprise at least one of: C-ions and/or B, N, O, Ga, He, Ne, Ar, Kr, Xe, and/or the like.

66. The apparatus of embodiment 65, configured to use one or more noble gas ions to promote outgassing to leave the layer free of additional dopants.

67. The apparatus of any preceding embodiment, comprising an electrical connection connected to the layer and configured to provide a voltage/current or ground connection so as to prevent charging of the layer.

68. The apparatus of any preceding embodiment, wherein the energy delivery system comprises an anodization system configured to provide an electric field potential between the layer comprising metal and an electrode for producing the electric field, the apparatus being configured to provide a reactive medium for chemically converting the at least one portion of the layer to change the chemical composition of the at least one portion.

69. The apparatus of embodiment 68, wherein the apparatus is configured to deposit a protective layer and/or clearout protective layer on the layer around the at least one portion of the layer.

70. The apparatus of embodiment 68 or 69, comprising a liquid application system configured to provide an electrically conducting liquid between the at least one portion of the layer comprising metal and the electrode.

71. The apparatus of embodiment 70, comprising a substrate support configured to support the substrate such that at least part of the substrate is not in contact with the conducting liquid.

72. The apparatus of embodiment 70 or 71, comprising an insulating layer applicator configured to apply an insulating layer on at least part of the substrate to prevent contact between the part of the substrate and the conducting liquid.

73. The apparatus of any one of embodiments 68 to 72, wherein the anodization system comprises an energy source connected to the metal layer and the electrode for producing the electric field therebetween, and optionally wherein the energy source is configured to provide continuous and/or pulsed voltage and/or current.

74. The apparatus of embodiment 73, wherein the energy source comprises a voltage source that is electrically connected to the metal layer and the electrode with a polarity such that the metal layer forms an anode and the electrode forms a cathode.

75. The apparatus of any one of embodiments 68 to 74, wherein the anodization system is configured to perform electrochemical and/or photoelectrochemical anodization to modify the at least one portion of the layer comprising metal.

76. The apparatus of any one of embodiments 68 to 75, wherein the at least one portion is defined in a preceding litho-etch process via an opening in a protective layer provided or formed on top of the layer comprising metal.

77. The apparatus of any one of embodiments 68 to 76, wherein the at least one portion is defined by a focused beam of the energy delivery system.

78. The apparatus of any one of embodiments 44 to 77, wherein the energy delivery system is configured to modify the at least one portion of the layer comprising metal in the presence of a reactive medium so as to chemically, electrochemically and/or photoelectrochemically convert the at least one portion of the layer to change the chemical composition of the at least one portion.

79. The apparatus of embodiment 78, comprising a chamber for containing the reactive medium.

80. The apparatus of embodiment 79, wherein the chamber is configured to allow radiation and/or particles to interact with the layer comprising metal, and optionally wherein the chamber comprises a transparent section for allowing the radiation and/or particles to enter the chamber, and/or optionally wherein the energy delivery system is provided within the chamber.

81. The apparatus of embodiment 78, 79 or 80, wherein the reactive medium comprises a gas and/or liquid.

82. The apparatus of any one of embodiments 78 to 81, wherein the reactive medium comprises atoms, ions or molecules of at least one of: oxygen (O); oxide; hydrogen (H); boron (B); boride; carbon (C); carbide; nitrogen (N); nitride; chlorine (Cl); chloride; bromine (Br); bromide; fluorine (F); fluoride; iodine (I); iodide; silicon (Si); silicide; phosphorous (P); phosphide.

83. The apparatus of any one of embodiments 78 to 82, wherein the metal comprises tungsten.

84. The apparatus of any one of embodiments 78 to 83, wherein the energy delivery system is configured to cause a change in the chemical composition of the layer comprising metal such that at least one atom, ion or molecule in the reactive medium is reacted with the metal to form a new chemical compound within the at least one portion.

85. The apparatus of any one of embodiments 78 to 84, wherein the energy delivery system is further configured to deliver UV, DUV and/or EUV radiation for breaking chemical bonds in the reactive medium.

86. The apparatus of any preceding embodiment, comprising a debris removal system for removing from a surface of the layer debris generated during the modification, and optionally wherein the debris removal system comprises at least one of: an electric discharge; gas and/liquid flow; and reactive medium for removing the debris.

87. The apparatus of any preceding embodiment, comprising a cooling system for contacting a gas and/or liquid with the substrate to remove heat therefrom, and optionally wherein the cooling system is configured to deliver the gas and/or liquid to at least the parts of the layer modified by the energy delivery system.

88. The apparatus of any preceding embodiment, comprising an auxiliary layer deposition system for depositing a layer on the substrate, and optionally wherein the auxiliary layer deposition system is configured to deposit a protective layer, electro-insulating layer, BARC, and/or resist on the substrate and/or the layer comprising carbon or metal, and/or the other parts of the substrate.

89. The apparatus of any preceding embodiment, wherein the least one portion of the opaque layer is modified prior to the deposition of optional BARC and resist layers and patterning of the substrate in a litho tool.

90. The apparatus of any preceding embodiment, comprising a layer deposition system, wherein the layer deposition system is operable to vary deposition conditions for the creation of at least one seed sub-layer in the layer, and optionally wherein the seed sub-layer comprises sp3-coordinated carbon for acting as seed sub-layer for nanodiamond nucleation and/or diamond-like carbon, DLC, and optionally wherein the concentration of sp3 coordinated carbon atoms in the seed sub-layer is higher than in other sub-layers.

91. The apparatus of embodiment 90, wherein the layer deposition system is configured such that that for an opaque carbon layer, an extra layer with a relatively increased concentration of tetravalent carbon atom, and thickness smaller than the layer is provided as the seed sub-layer.

92. The apparatus of embodiment 90 or 91, wherein the layer deposition system is configured such that structural modification of the layer comprising carbon is used to increase transparency of a lower part of the layer deposited by a first deposition process, while an upper part of the layer is provided after the modification by a second deposition process.

93. The apparatus of any preceding embodiment, comprising a layer removal system for removing material from the substrate, and optionally wherein the layer removal system comprises a litho-etch system configured such that material removed from the substrate corresponds to a location and size of the at least one feature, and/or optionally wherein the layer removal system comprises a chemical-mechanical polisher (CMP) device; and/or optionally wherein the layer removal system comprises an ablation system.

94. The apparatus of embodiment 93, wherein the layer removal system is configured to at least partially remove and/or planarize at least one of: a protective layer on the substrate, electro-insulating layer on the substrate, BARC and/or resist on the substrate, the layer comprising carbon or metal, and/or modified carbon or metal in the layer comprising carbon or metal.

95. The apparatus of any preceding embodiment, further comprising a feedback control system configured to determine one or more parameters of the at least one portion of the layer and to control the energy delivery system based on the one or more parameters.

96. The apparatus of embodiment 95, wherein the feedback control system comprises a radiation sensor, and optionally wherein the radiation sensor is configured to receive radiation from the at least one portion of the layer, and/or optionally wherein radiation received by the feedback control system comprises reflected and/or scattered radiation generated by the energy delivery system.

97. A method for determining information relating to at least one feature in a semiconductor device substrate, wherein the at least one feature is at least partially obscured by a layer comprising carbon or metal, such that an optical signal for determining information relating to the at least one feature is prevented from reaching the feature, the method comprising:
modifying, by an energy delivery system, at least one portion of the layer to increase its transparency such that at least part of the optical signal for determining the information relating to the at least one feature can propagate through the at least one portion of the layer for determining the information relating to the at least one feature.

98. An apparatus for determining information relating to at least one feature in a semiconductor device substrate, wherein the at least one feature is at least partially obscured by a layer comprising carbon, such that an optical signal for determining the information relating to the at least one feature is prevented from reaching the feature, wherein the apparatus comprises:

an energy delivery system configured for modifying at least one portion of the layer to increase its transparency such that at least part of the optical signal can propagate through the at least one portion of the layer for determining the information relating to the at least one feature, wherein the energy delivery system is configured to emit a beam for modifying the at least one portion of the layer by causing a phase change in the carbon and/or causing an increase in the concentration of tetravalent (sp3 coordinated) carbon atoms at the at least one portion of the layer.

99. The apparatus of embodiment 98, wherein the phase change modifies the carbon at the at least one portion of the layer such that the carbon forms at least one of: diamond; and diamond-like carbon.

100. The apparatus of embodiment 98, wherein the energy delivery system comprises at least one of: at least one pulsed laser source for emitting radiation and/or at least one source of a focused beam of energetic particles.

101. The apparatus of embodiment 100, wherein the at least one laser is configured to emit one or more of: visible and/or infrared laser pulses with a pulse duration in a range from 5 fs to 500 ps;

ultraviolet laser pulses with a pulse duration in the range 1 ps to 500 ns; and soft X-ray to DUV laser pulses with a pulse duration in the range 1 fs to 100 ns.

102. The apparatus of embodiment 100, wherein the at least one laser is configured to emit an initial pulse train comprising at least one laser pulse of a first pulse duration, and further configured to emit a subsequent pulse train comprising at least one laser pulse of a shorter, second pulse duration.

103. The apparatus of embodiment 100, wherein the at least one pulsed laser source is configured to emit radiation having a peak radiant fluence or intensity of radiation below an ablation threshold for the layer.

104. The apparatus of embodiment 98, wherein the energy delivery system is configured to emit radiation and/or particles for pulsed heating of the at least one portion of the layer.

105. The apparatus of embodiment 104, wherein the energy delivery system is configured to emit one or more of: an electron beam; an ion beam; a neutral beam; an extreme ultraviolet (EUV) beam in a range from 5 to 20 nm; and a beam comprising radiation having wavelengths in a range from 20 to 100 nm.

106. An apparatus for determining information relating to at least one feature in a semiconductor device substrate, wherein the at least one feature is at least partially obscured by a layer comprising metal, such that an optical signal for determining the information relating to the at least one feature is prevented from reaching the feature, wherein the apparatus comprises:

an energy delivery system configured for modifying at least one portion of the layer to increase its transparency such that at least part of the optical signal can propagate through the at least one portion of the layer for determining the information relating to the at least one feature.

107. The apparatus of embodiment 106, wherein the energy delivery system is configured to emit radiation and/or particles to modify the at least one portion of the layer comprising metal.

108. The apparatus of embodiment 106, wherein the energy delivery system is configured to modify the at least one portion of the layer comprising metal in the presence of a reactive medium so as to chemically convert the at least one portion of the layer to change the chemical composition of the at least one portion.

109. The apparatus of embodiment 107, wherein the energy delivery system is configured to provide an ion beam to saturate the layer comprising metal with other atoms, ions or molecules to increase the transparency in the at least one portion of the layer comprising metal.

110. The apparatus of embodiment 107, wherein the energy delivery system comprises an anodization system configured to provide an electric field potential between the layer comprising metal and an electrode for producing the electric field, the apparatus being configured to provide a reactive medium for chemically converting the at least one portion of the layer to change the chemical composition of the at least one portion.

111. A method for enabling determining information relating to at least one feature in a semiconductor device substrate, wherein the at least one feature is at least partially obscured by a layer comprising carbon, such that an optical signal for determining information relating to the at least one feature is prevented from reaching the feature, the method comprising:

modifying, by an energy delivery system, at least one portion of the layer to increase its transparency by emitting a beam causing a phase change in the carbon and/or causing an increase in the concentration of tetravalent (sp3 coordinated) carbon atoms at the at least one portion of the layer.

112. A method for enabling determining information relating to at least one feature in a semiconductor device substrate, wherein the at least one feature is at least partially obscured by a layer comprising metal, such that an optical signal for determining information relating to the at least one feature is prevented from reaching the feature, the method comprising:

modifying, by an energy delivery system, at least one portion of the layer comprising metal to increase its transparency such that at least part of the optical signal for determining the information relating to the at least one feature can propagate through the at least one portion of the layer comprising metal.

Computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Accordingly, the invention may be embodied in hardware and/or in software (including firmware, resident software, micro-code, etc.) that runs on a processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

While specific examples of the present disclosure have been described above, it will be appreciated that the present disclosure may be practiced otherwise than as described. The descriptions above are intended to be illustrative, not limiting. Thus it will be apparent to one skilled in the art that modifications may be made to the present disclosure as described without departing from the scope of the claims set out below.

The invention claimed is:

1. An apparatus for determining information relating to at least one feature in or on a semiconductor device substrate, wherein the at least one feature is at least partially obscured by a layer comprising carbon, such that an optical signal for determining the information relating to the at least one feature is prevented from reaching the feature, the apparatus comprising:
an energy delivery system configured to modify at least one portion of the layer to increase its transparency such that at least part of the optical signal can propagate through the at least one portion of the layer for determining the information relating to the at least one feature, wherein the energy delivery system is configured to emit a beam for modifying the at least one portion of the layer by causing a phase change in the carbon and/or causing an increase in the concentration of tetravalent (sp3 coordinated) carbon atoms at the at least one portion of the layer.

2. The apparatus of claim 1, wherein the energy delivery system is configured to emit a beam for modifying the at least one portion of the layer by causing a phase change in the carbon and wherein the phase change modifies the carbon at the at least one portion of the layer such that the carbon forms diamond and/or diamond-like carbon.

3. The apparatus of claim 1, wherein the energy delivery system comprises at least one pulsed laser source for emitting radiation and/or at least one source of a focused beam of energetic particles.

4. The apparatus of claim 3, wherein the energy delivery system comprises at least one pulsed laser source for emitting radiation and wherein the at least one laser source is configured to emit one or more selected from:
visible and/or infrared laser pulses with a pulse duration in a range from 5 fs to 500 ps;
ultraviolet laser pulses with a pulse duration in the range 1 ps to 500 ns; and/or
soft X-ray to DUV laser pulses with a pulse duration in the range 1 fs to 100 ns.

5. The apparatus of claim 3, wherein the energy delivery system comprises at least one pulsed laser source for emitting radiation and wherein the at least one laser source is configured to emit an initial pulse train comprising at least one laser pulse of a first pulse duration, and further configured to emit a subsequent pulse train comprising at least one laser pulse of a shorter, second pulse duration.

6. The apparatus of claim 3, wherein the energy delivery system comprises at least one pulsed laser source for emitting radiation and wherein the at least one pulsed laser source is configured to emit radiation having a peak radiant fluence or intensity of radiation below an ablation threshold for the layer.

7. The apparatus of claim 1, wherein the energy delivery system is configured to emit radiation and/or particles for pulsed heating of the at least one portion of the layer.

8. The apparatus of claim 7, wherein the energy delivery system is configured to emit one or more selected from: an electron beam; an ion beam; a neutral beam; an extreme ultraviolet (EUV) beam with a wavelength in a range from 5 to 20 nm; and/or a beam comprising radiation having a wavelength in a range from 20 to 100 nm.

9. The apparatus of claim 1, further comprising a feedback control system configured to determine one or more parameters of the at least one portion of the layer and to control the energy delivery system based on the one or more parameters.

10. The apparatus of claim 9, wherein the feedback control system comprises a radiation sensor configured to receive radiation from the at least one portion of the layer, and wherein the feedback control system is configured to determine the one or more parameters of the at least one portion of the layer based on the received radiation.

11. The apparatus of claim 10, wherein the received radiation comprises one or more selected from:
the radiation from the energy delivery system reflected or scattered from the at least one portion of the layer;
radiation that has propagated through the at least one portion of the layer and that has been emitted from a radiation source configured to backlight the semiconductor device substrate;
radiation excited in the portion of the layer by radiation and/or particles from the energy delivery system; and/or
radiation from an auxiliary radiation source, directed to and reflected and/or scattered from a spot that overlaps substantially with the portion of the layer that is modified by the energy delivery system.

12. The apparatus of claim 1, wherein the energy delivery system is configured to emit radiation and/or particles for modifying the transparency of the at least one portion of the layer to a depth less than the overall thickness of the layer.

13. The apparatus of claim 1, further comprising a layer deposition system configured to deposit the layer on the substrate.

14. The apparatus of claim 13, wherein the layer deposition system is configured to deposit a first sub-layer of the layer on the substrate, and wherein the energy delivery system is operable to modify at least one portion in the first sub-layer.

15. The apparatus of claim 13, wherein the layer deposition system is configured to vary deposition conditions for the creation of at least one seed sub-layer in the layer, the seed sub-layer comprising sp3-coordinated carbon for acting as a seed for nanodiamond nucleation and/or diamond-like carbon.

16. The apparatus of claim 1, further comprising a debris removal system configured to remove, from a surface of the layer, debris particles generated during the modification.

17. The apparatus of claim 1, further comprising a chamber configured to hold a liquid, and wherein the semiconductor device substrate is at least partially immersed in the liquid at least during emission of the radiation and/or particles by the energy delivery system.

18. A method for enabling determining information relating to at least one feature in or on a semiconductor device substrate, wherein the at least one feature is at least partially obscured by a layer comprising carbon, such that an optical signal for determining information relating to the at least one feature is prevented from reaching the feature, the method comprising:

modifying, by an energy delivery system, at least one portion of the layer to increase its transparency by emitting a beam causing a phase change in the carbon and/or causing an increase in the concentration of tetravalent (sp3 coordinated) carbon atoms at the at least one portion of the layer.

19. The method of claim 18, comprising modifying the at least one portion of the layer by causing a phase change in the carbon, wherein the phase change modifies the carbon at the at least one portion of the layer such that the carbon forms diamond and/or diamond-like carbon.

20. The method of claim 18, wherein the energy delivery system comprises at least one pulsed laser source for emitting radiation and/or at least one source of a focused beam of energetic particles.

21. A computer program product comprising a non-transitory computer-readable medium having instructions therein, the instructions, upon execution by a processor system, configured to cause the processor system to at least control an apparatus to at least:

modify, by an energy delivery system, at least one portion of a layer comprising carbon that at least partially obscures at least one feature in or on a semiconductor device substrate such that an optical signal for determining information relating to the at least one feature is prevented from reaching the feature, the energy delivery system increasing transparency of the at least one portion of a layer by emitting a beam causing a phase change in the carbon and/or causing an increase in the concentration of tetravalent (sp3 coordinated) carbon atoms at the at least one portion of the layer.

* * * * *